United States Patent
Mukesh et al.

(10) Patent No.: US 12,490,480 B2
(45) Date of Patent: Dec. 2, 2025

(54) STACKED FETS WITH CONTACT PLACEHOLDER STRUCTURES

(71) Applicant: International Business Machines Corporation, Armonk, NY (US)

(72) Inventors: Sagarika Mukesh, Albany, NY (US); Tao Li, Slingerlands, NY (US); Prabudhya Roy Chowdhury, Albany, NY (US); Liqiao Qin, Albany, NY (US); Nikhil Jain, Apple Valley, MN (US); Ruilong Xie, Niskayuna, NY (US)

(73) Assignee: International Business Machines Corporation, Armonk, NY (US)

( * ) Notice: Subject to any disclaimer, the term of this patent is extended or adjusted under 35 U.S.C. 154(b) by 509 days.

(21) Appl. No.: 17/946,546

(22) Filed: Sep. 16, 2022

(65) Prior Publication Data
US 2024/0096951 A1   Mar. 21, 2024

(51) Int. Cl.
*H10D 62/10* (2025.01)
*H01L 23/48* (2006.01)
(Continued)

(52) U.S. Cl.
CPC ........ *H10D 62/121* (2025.01); *H01L 23/481* (2013.01); *H10D 62/151* (2025.01); *H10D 84/834* (2025.01)

(58) Field of Classification Search
CPC .. H10D 62/121; H10D 84/834; H10D 62/151; H01L 23/481
See application file for complete search history.

(56) References Cited

U.S. PATENT DOCUMENTS

| 7,160,761 B2 | 1/2007 | Cleeves et al. |
| 8,450,149 B2 | 5/2013 | Bayan et al. |

(Continued)

FOREIGN PATENT DOCUMENTS

| CN | 113424307 A | 9/2021 |
| CN | 119923967 A | 5/2025 |

(Continued)

OTHER PUBLICATIONS

Schuddinck, R. J., et al., "The Complementary FET (CFET) for CMOS scaling beyond N3", 2018 Symposium on VLSI Technology Digest of Technical Papers, Date of Conference: Jun. 18-22, 2018, 2 pages.

(Continued)

*Primary Examiner* — Christine A Enad
(74) *Attorney, Agent, or Firm* — Scully, Scott, Murphy & Presser, P.C.; Kimberly Zillig

(57) ABSTRACT

A semiconductor structure is provided that includes a first FET device region including a plurality of first FETs, each first FET of the plurality of first FETs includes a first source/drain region located on each side of a functional gate structure. A second FET device region is stacked above the first FET device region and includes a plurality of second FETs, each second FET of the plurality of second FETs includes a second source/drain region located on each side of a functional gate structure. The structure further includes at least one first front side contact placeholder structure located adjacent to one of the first source/drain regions of at least one the first FETs, and at least one second front side contact placeholder structure located adjacent to at least one of the second source/drain regions of at one of the second FETs.

19 Claims, 21 Drawing Sheets

(51) Int. Cl.
  *H10D 62/13*  (2025.01)
  *H10D 84/83*  (2025.01)

(56) References Cited

U.S. PATENT DOCUMENTS

| | | |
|---|---|---|
| 10,192,819 B1 | 1/2019 | Chanemougame et al. |
| 10,192,867 B1 | 1/2019 | Frougier et al. |
| 10,510,622 B1 | 12/2019 | Frougier et al. |
| 10,833,078 B2 | 11/2020 | Smith et al. |
| 11,239,208 B2 | 2/2022 | Chuang et al. |
| 11,251,182 B2* | 2/2022 | Kang ............ H10D 84/038 |
| 2008/0113483 A1 | 5/2008 | Wells |
| 2018/0204932 A1 | 7/2018 | Mehandru et al. |
| 2019/0172828 A1* | 6/2019 | Smith ............ H10D 88/00 |
| 2019/0229117 A1 | 7/2019 | Zhang et al. |
| 2020/0098921 A1 | 3/2020 | Rachmady et al. |
| 2020/0273755 A1 | 8/2020 | Wu et al. |
| 2020/0294998 A1 | 9/2020 | Lilak et al. |
| 2020/0381430 A1 | 12/2020 | Liebmann et al. |
| 2021/0098306 A1* | 4/2021 | Smith ............ H01L 21/28097 |
| 2021/0296314 A1 | 9/2021 | Kang et al. |
| 2021/0366907 A1 | 11/2021 | Liao et al. |
| 2022/0216340 A1 | 7/2022 | Lin et al. |

FOREIGN PATENT DOCUMENTS

| | | |
|---|---|---|
| DE | 102020103710 A1 | 9/2020 |
| EP | 4588098 A1 | 7/2025 |
| WO | 2020051292 A1 | 3/2020 |
| WO | 2024/056345 A1 | 3/2024 |

OTHER PUBLICATIONS

Zhang J et al: "Full Bottom Dielectric Isolation to Enable Stacked Nanosheet Transistor for Low Power and High Performance Applications", 2019 IEEE International Electron Devices Meeting (IEDM), IEEE, Dec. 7, 2019, 4 pages.

International Search Report and Written Opinion dated Dec. 4, 2023, received in a corresponding foreign application, namely International Application No. PCT/EP2023/073327, 17 pages.

Sacchetto, D., et al., "Fabrication and Characterization of Vertically Stacked Gate-All-Around Si Nanowire FET Arrays", 2009 Proceedings of the European Solid State Device Research Conference, Date of Conference: Sep. 14-18, 2009, 4 pages.

* cited by examiner

Section Y

Section X

Section Y

Section X

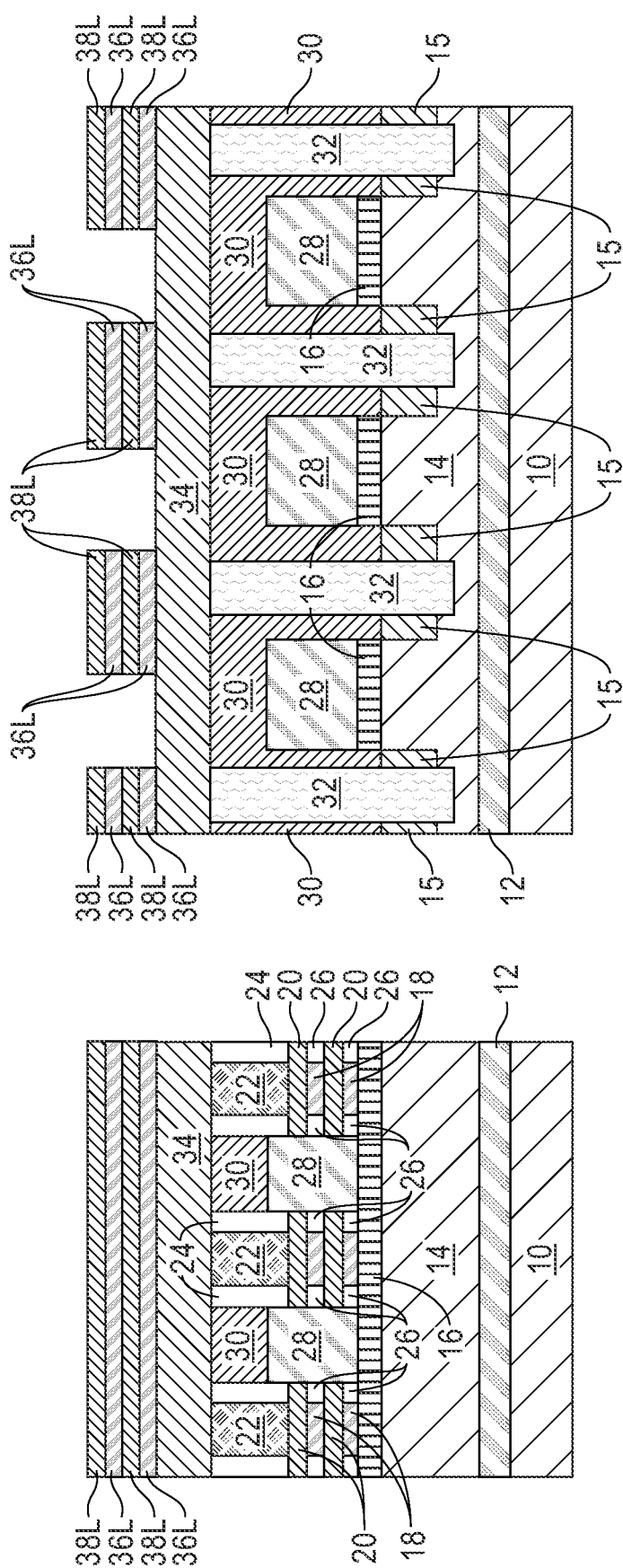
FIG. 4B Section Y
FIG. 4A Section X

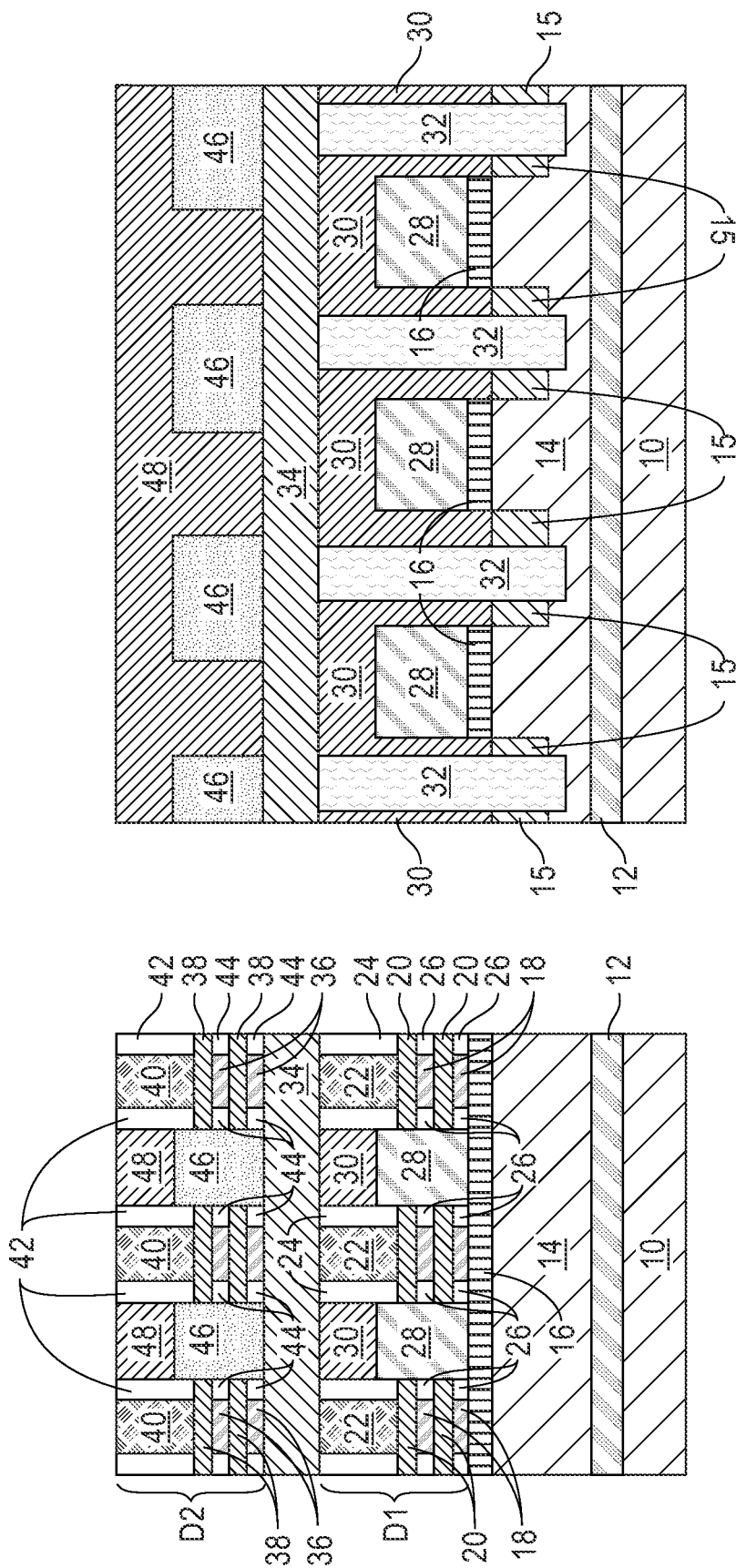

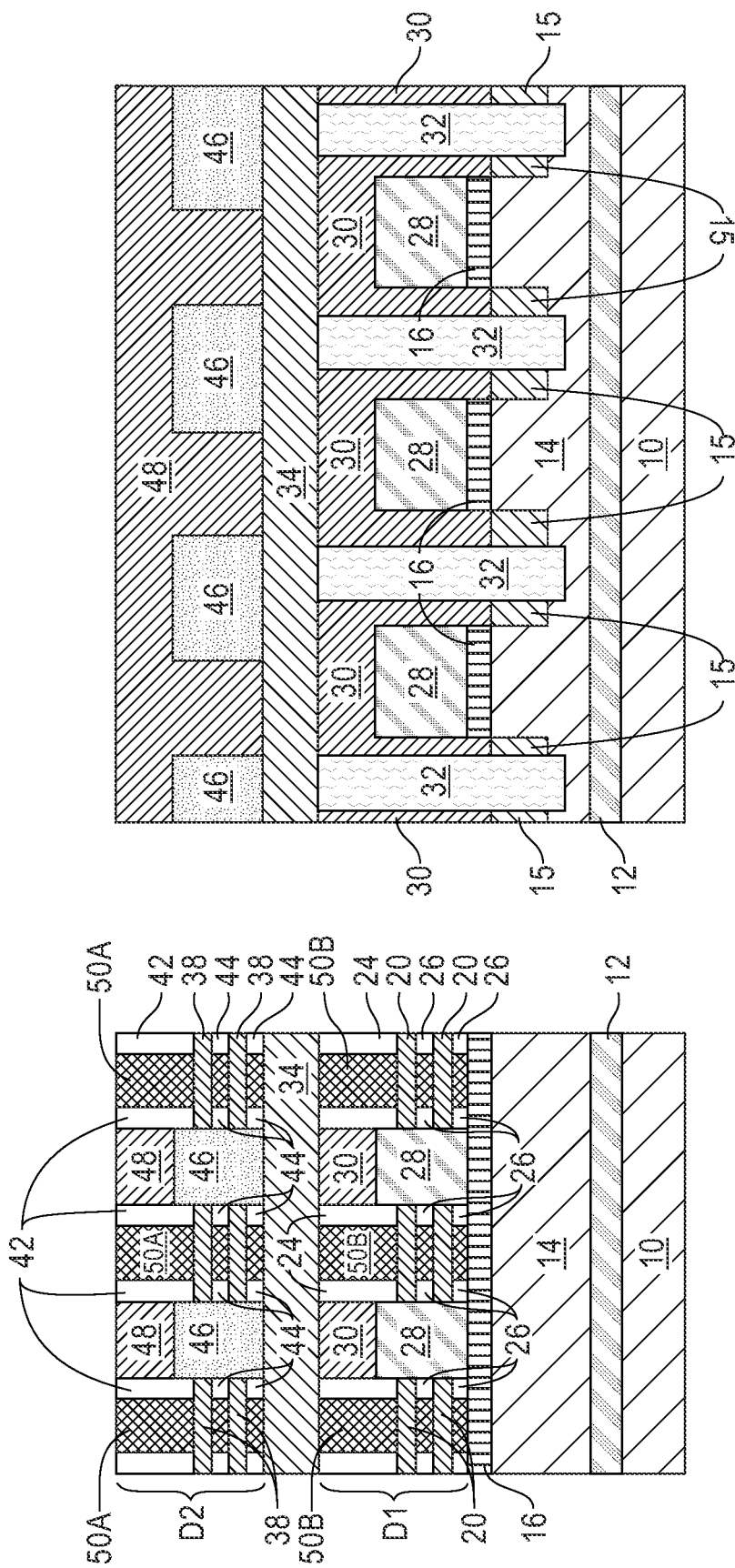
FIG. 6B Section Y
FIG. 6A Section X

Section Y

Section X

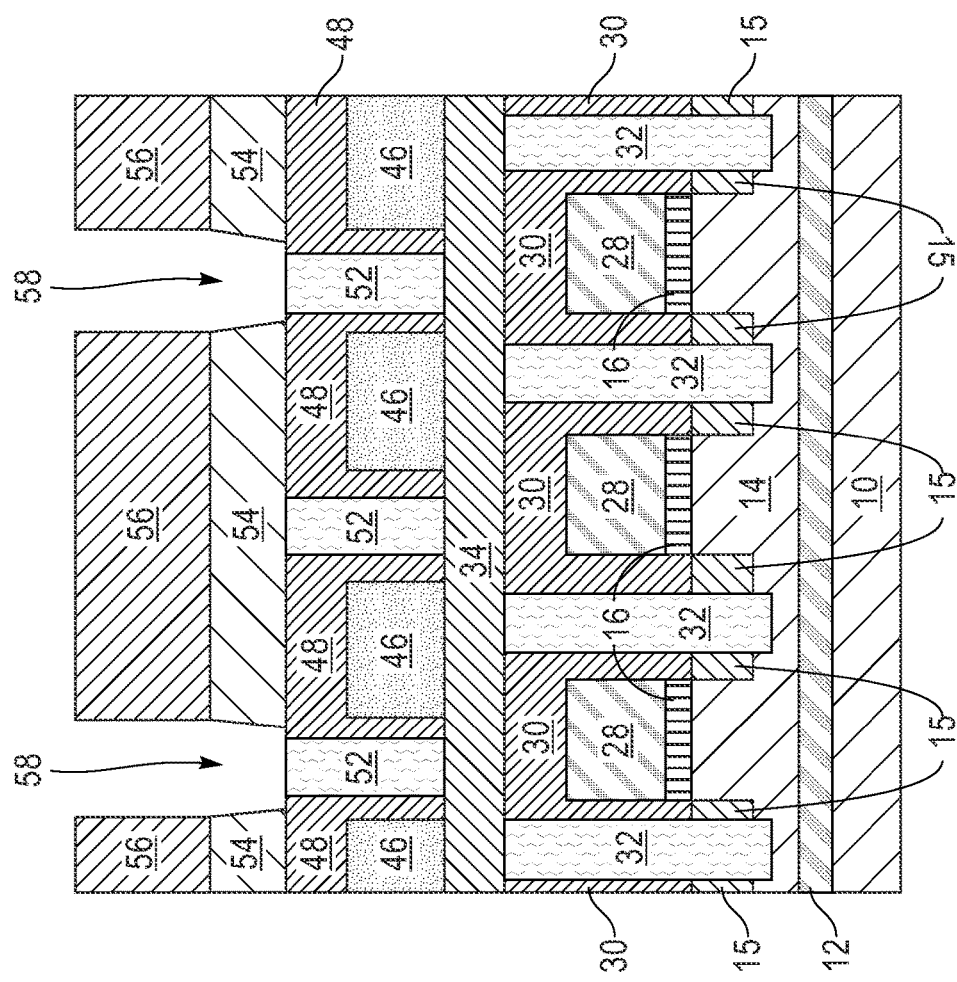
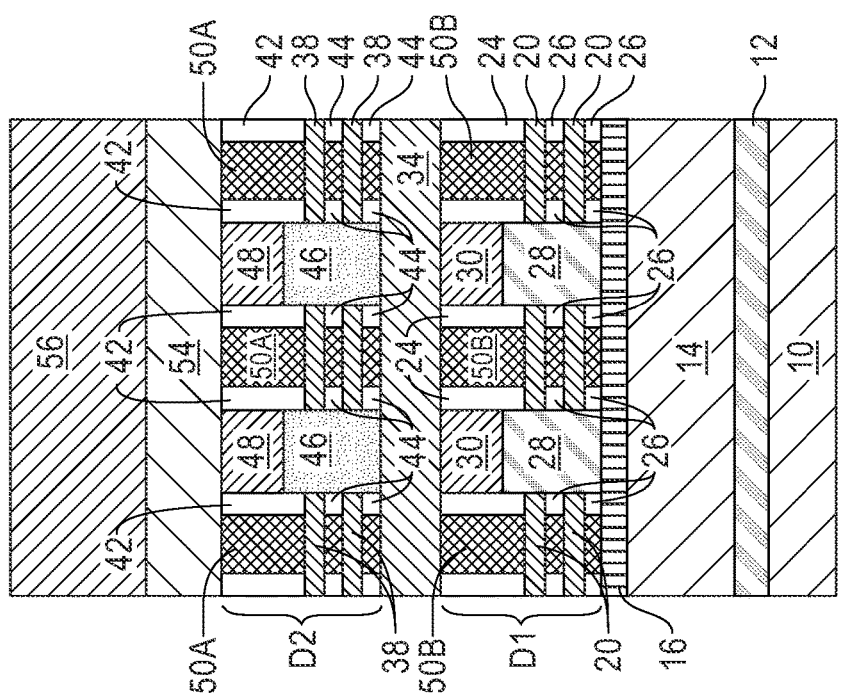
FIG. 8A
Section X
FIG. 8B
Section Y

Section Y

Section X

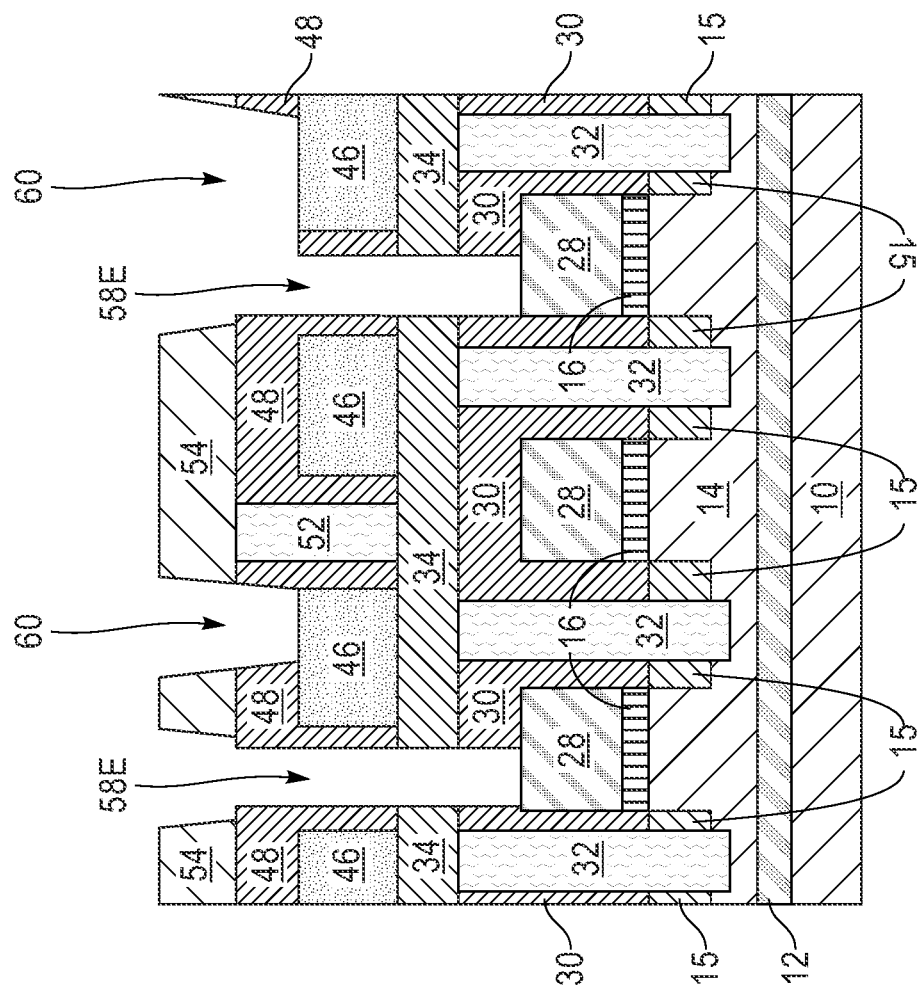
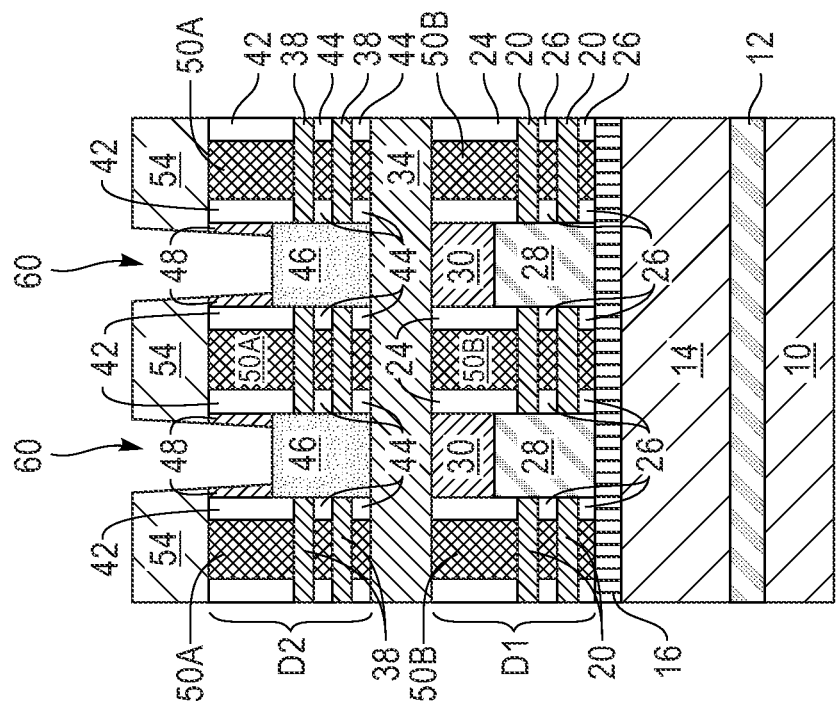
FIG. 10B Section Y
FIG. 10A Section X

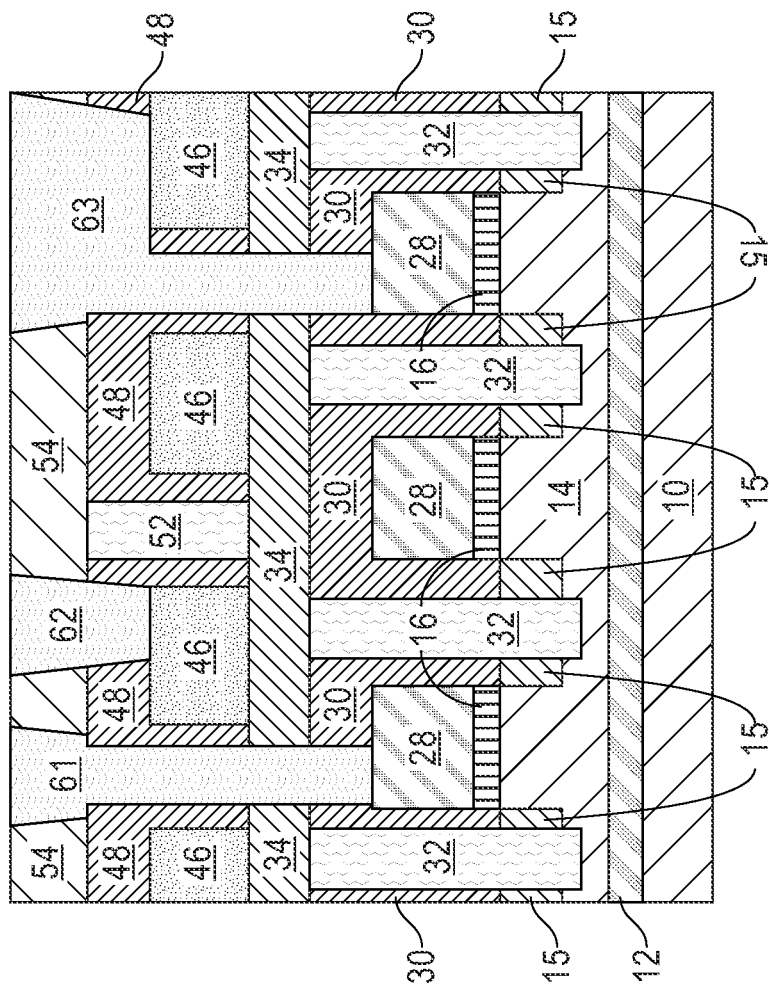
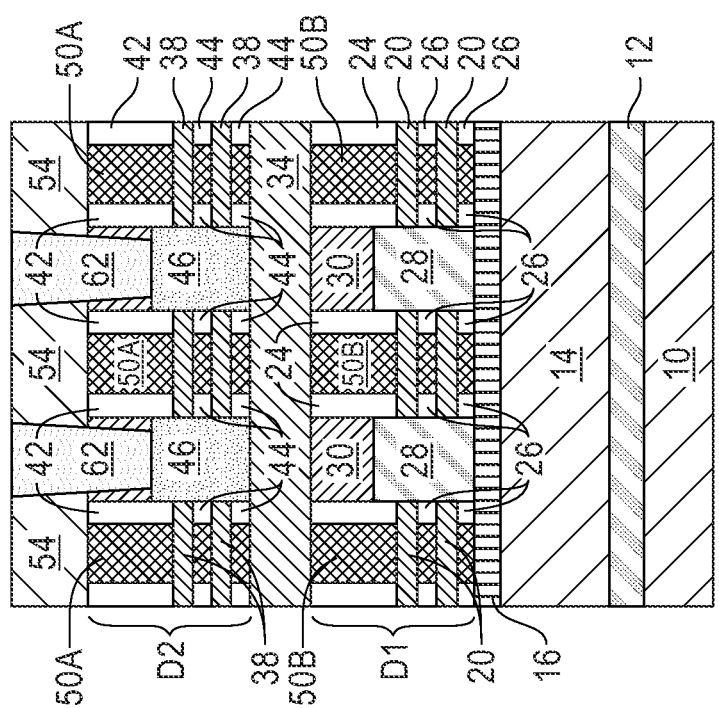
FIG. 11B Section Y
FIG. 11A Section X

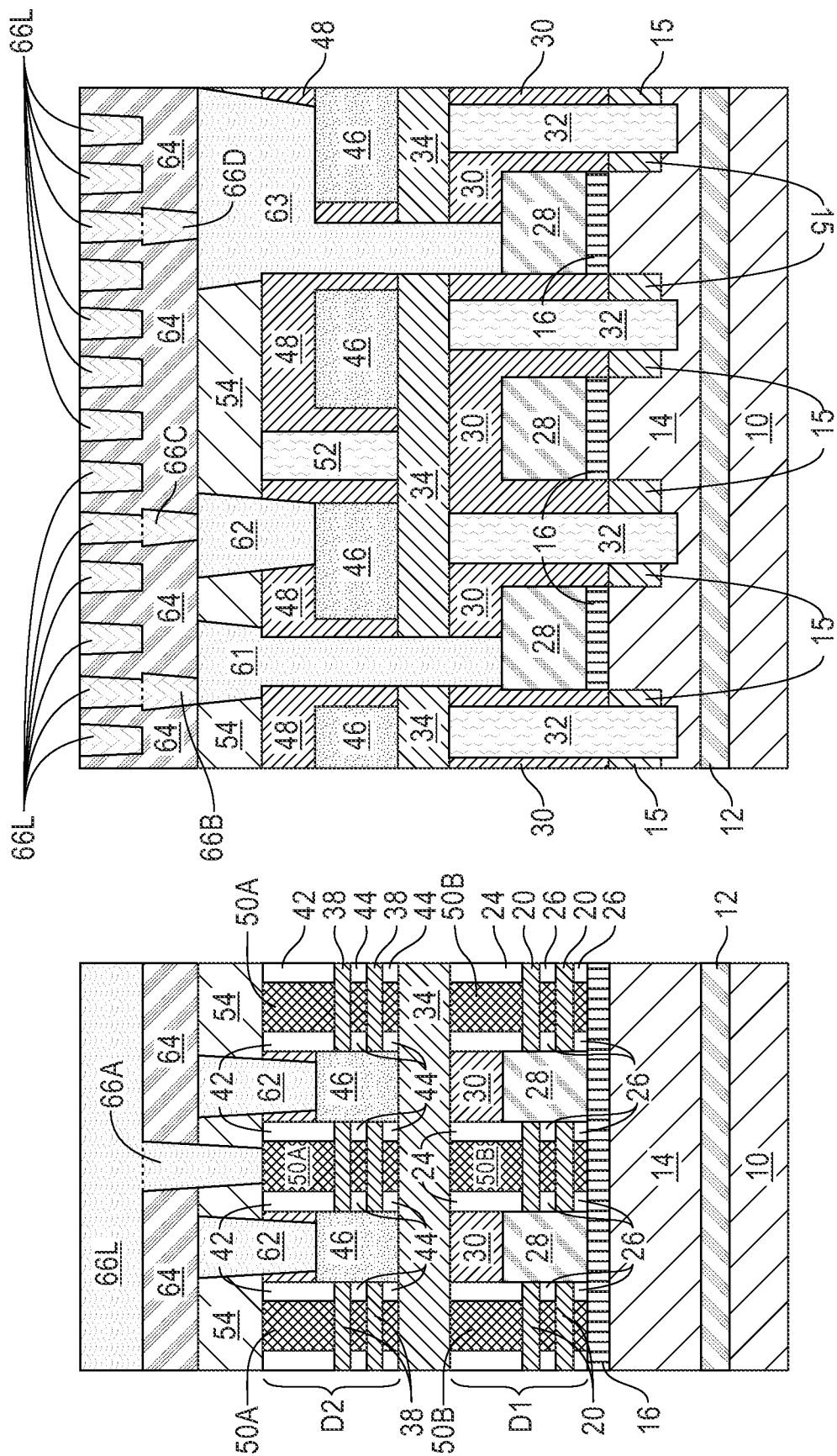

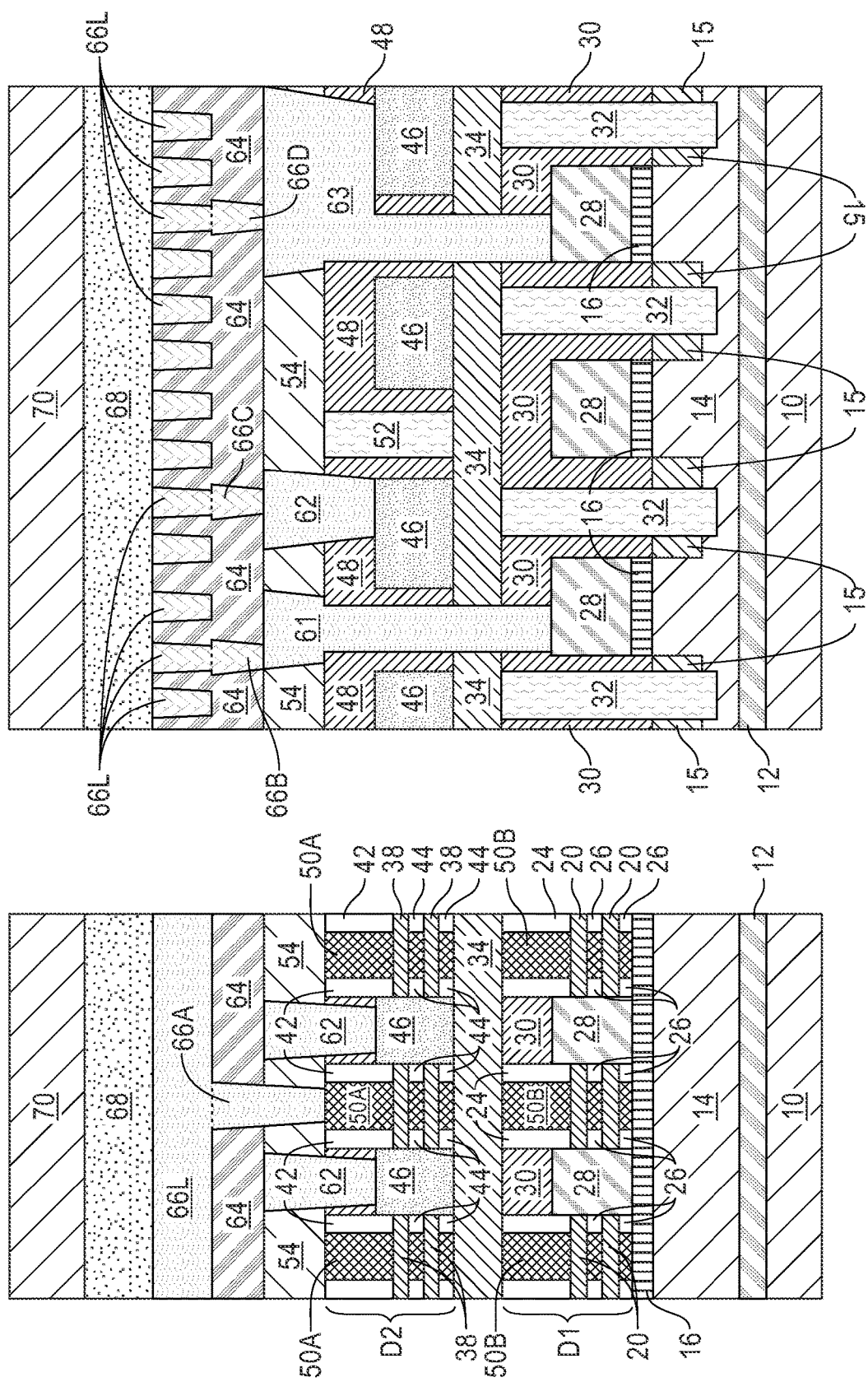
FIG. 13B Section Y
FIG. 13A Section X

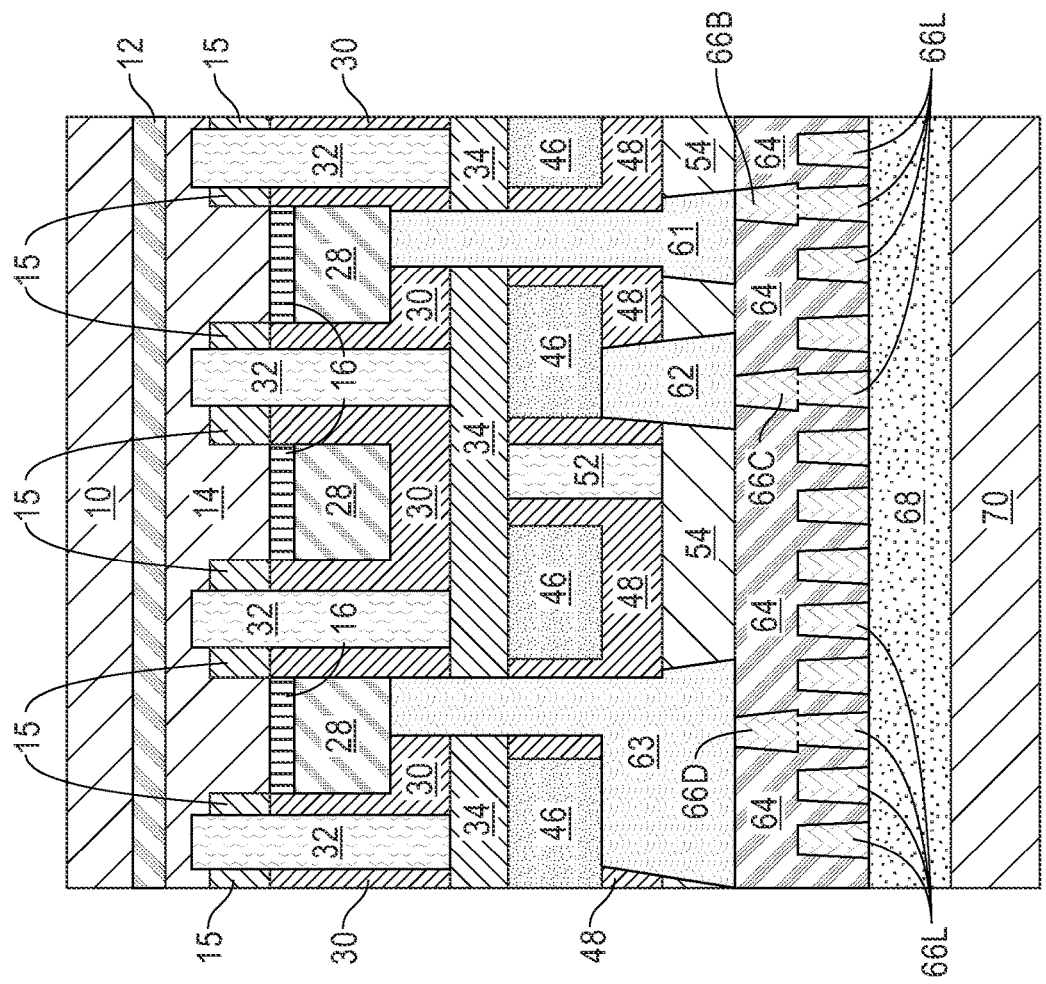
FIG. 14B Section Y
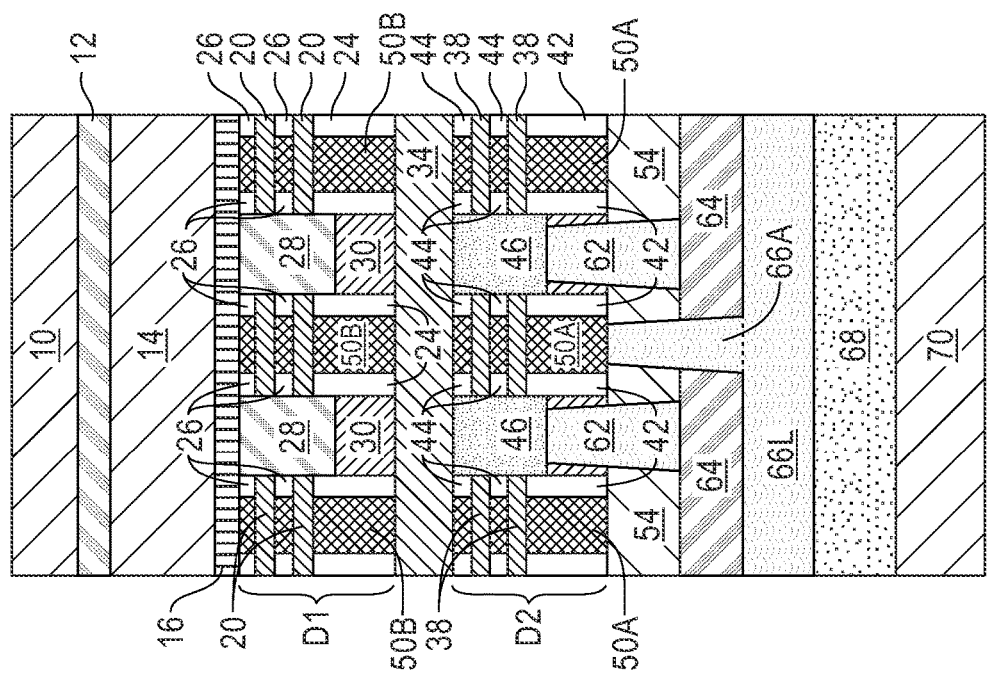
FIG. 14A Section X

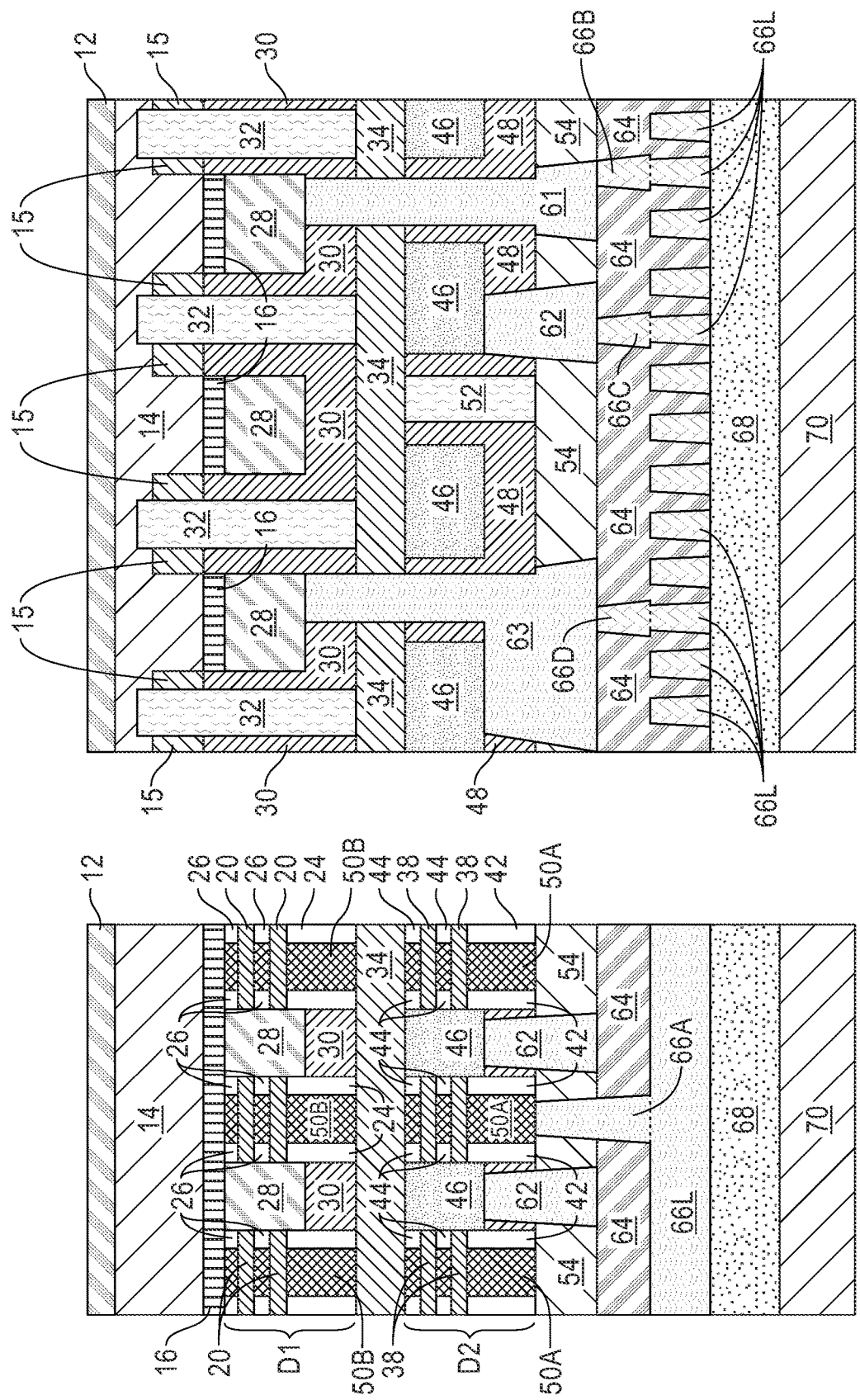
FIG. 15A Section X
FIG. 15B Section Y

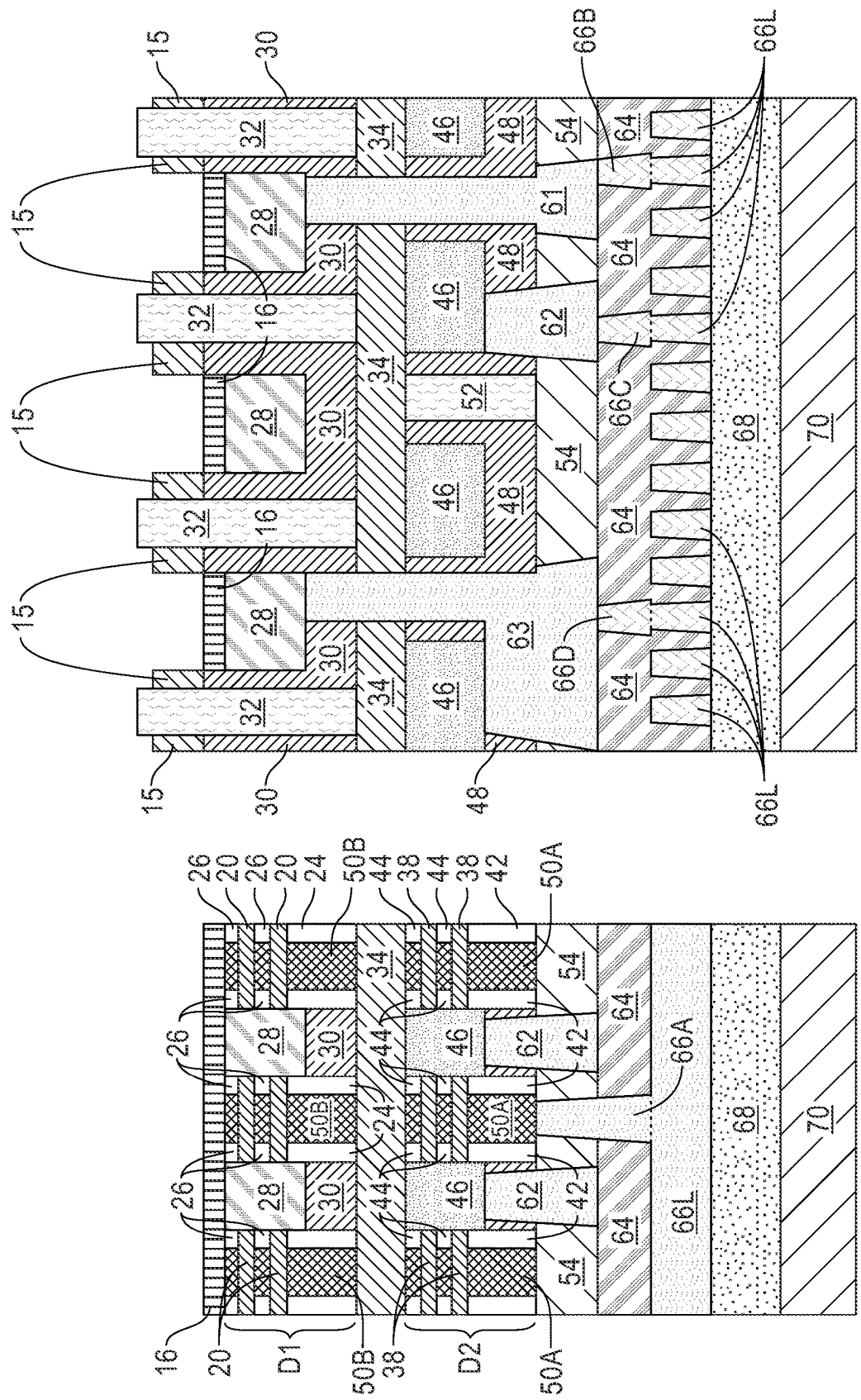
FIG. 16B Section Y
FIG. 16A Section X

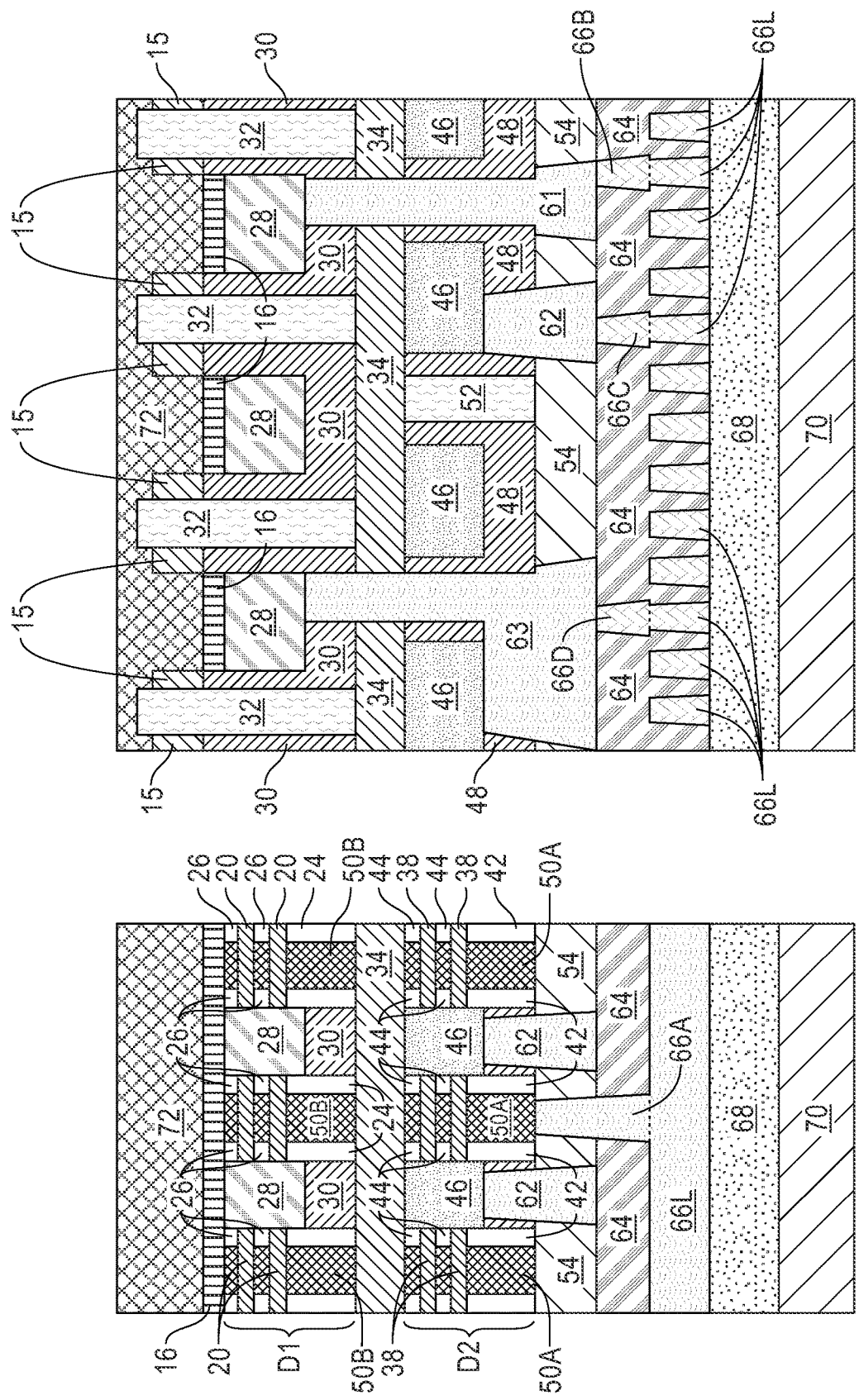
FIG. 17A Section X
FIG. 17B Section Y

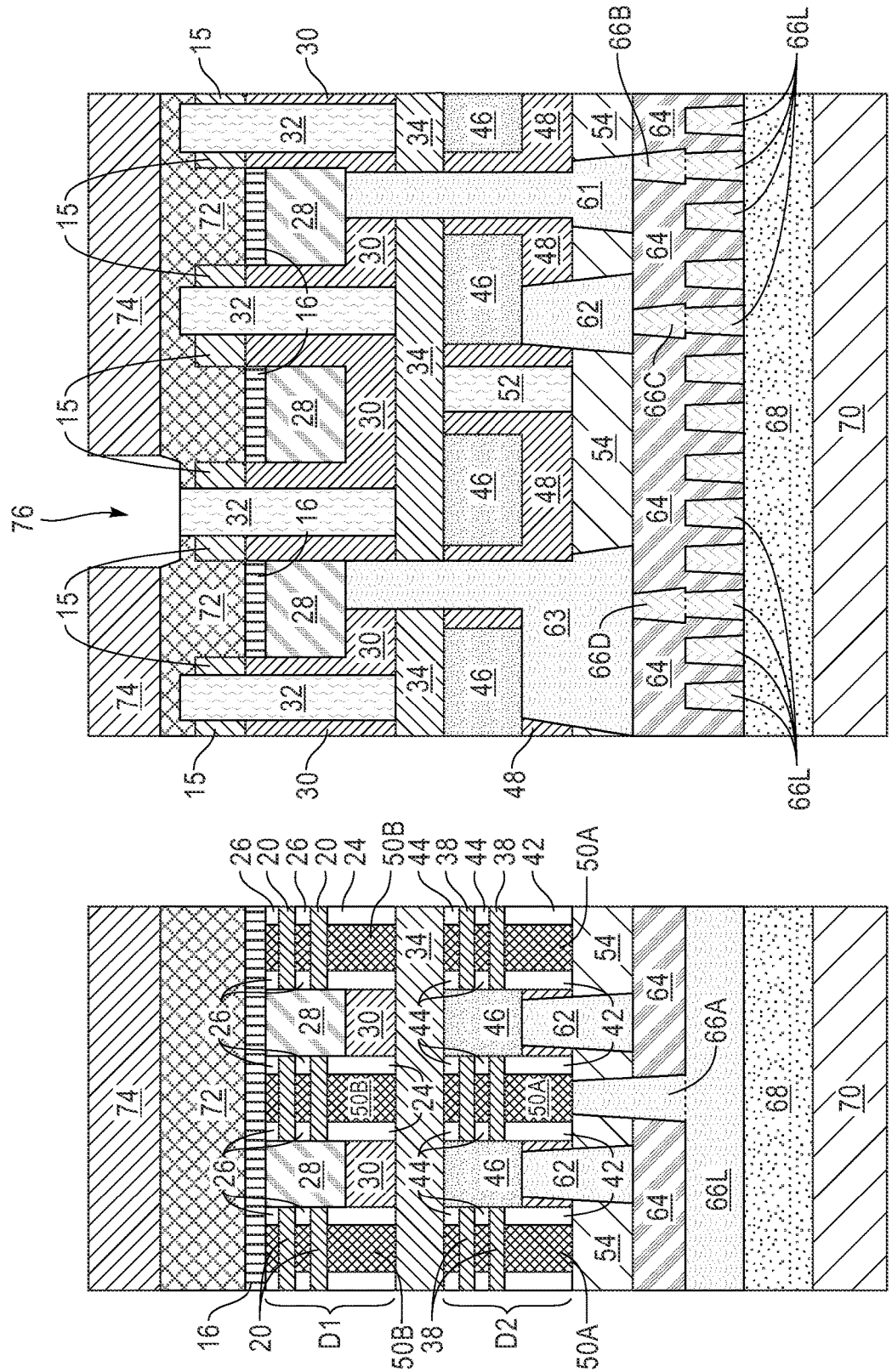
FIG. 18A Section X
FIG. 18B Section Y

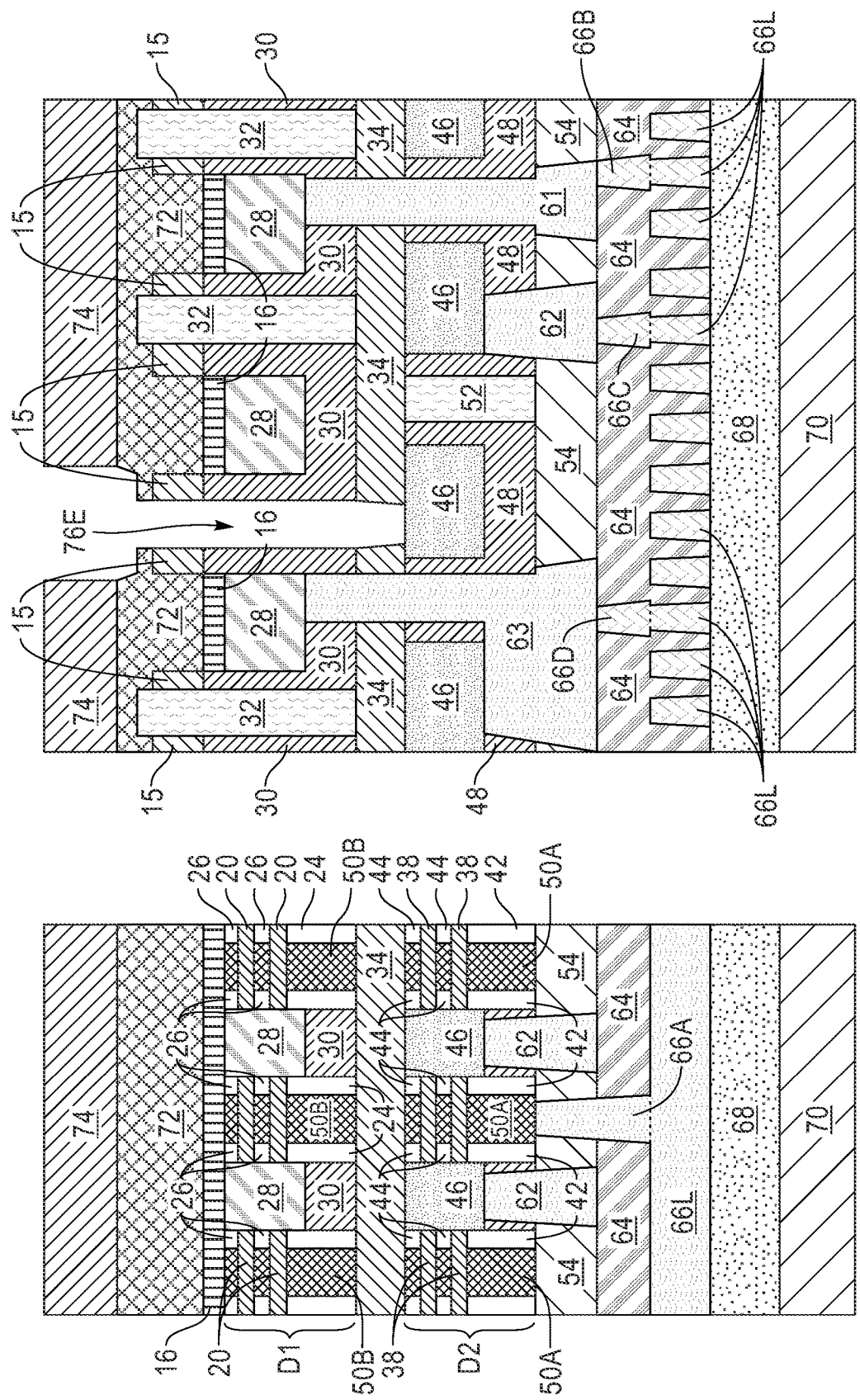
FIG. 19A Section X
FIG. 19B Section Y

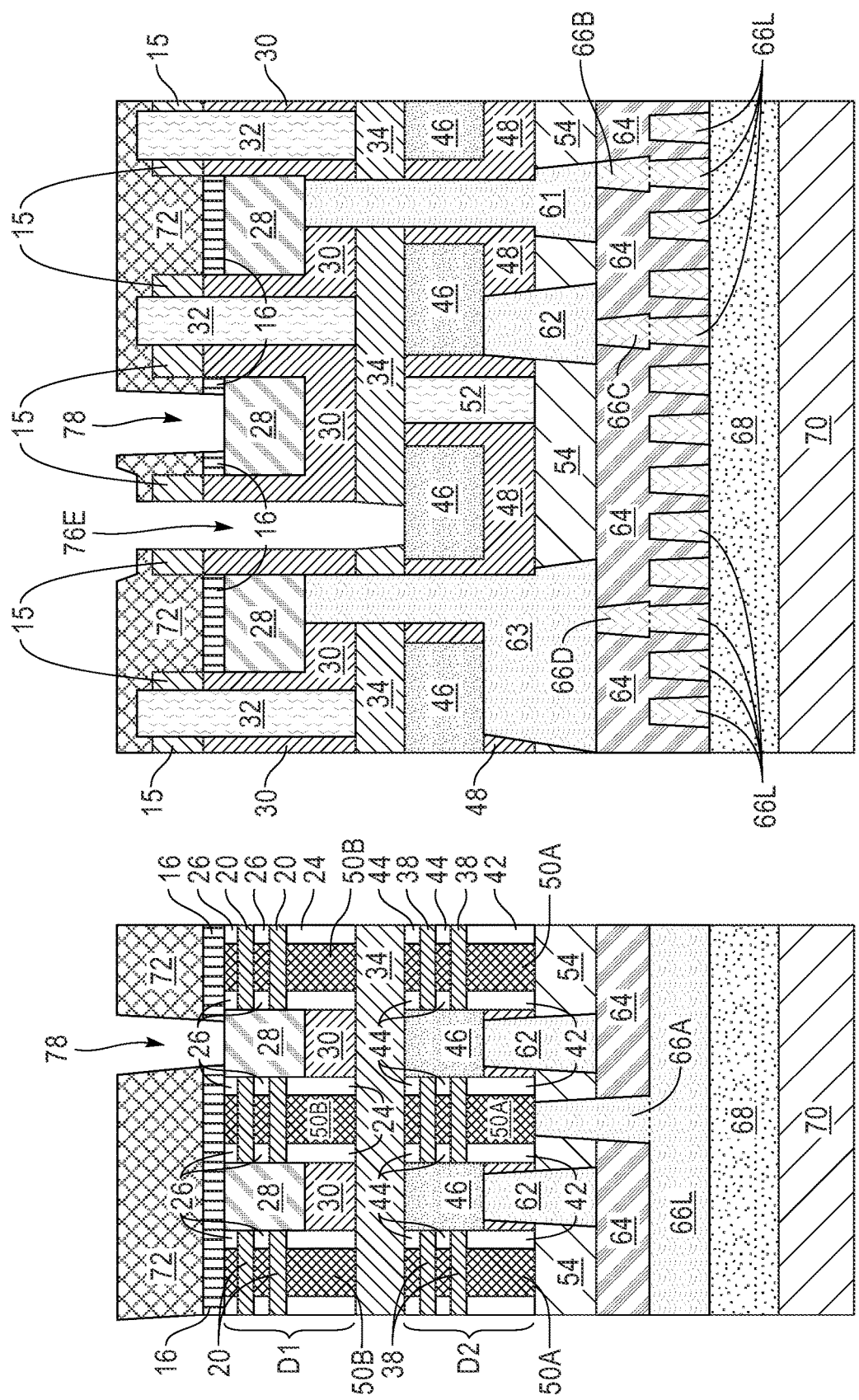
FIG. 20B Section Y
FIG. 20A Section X

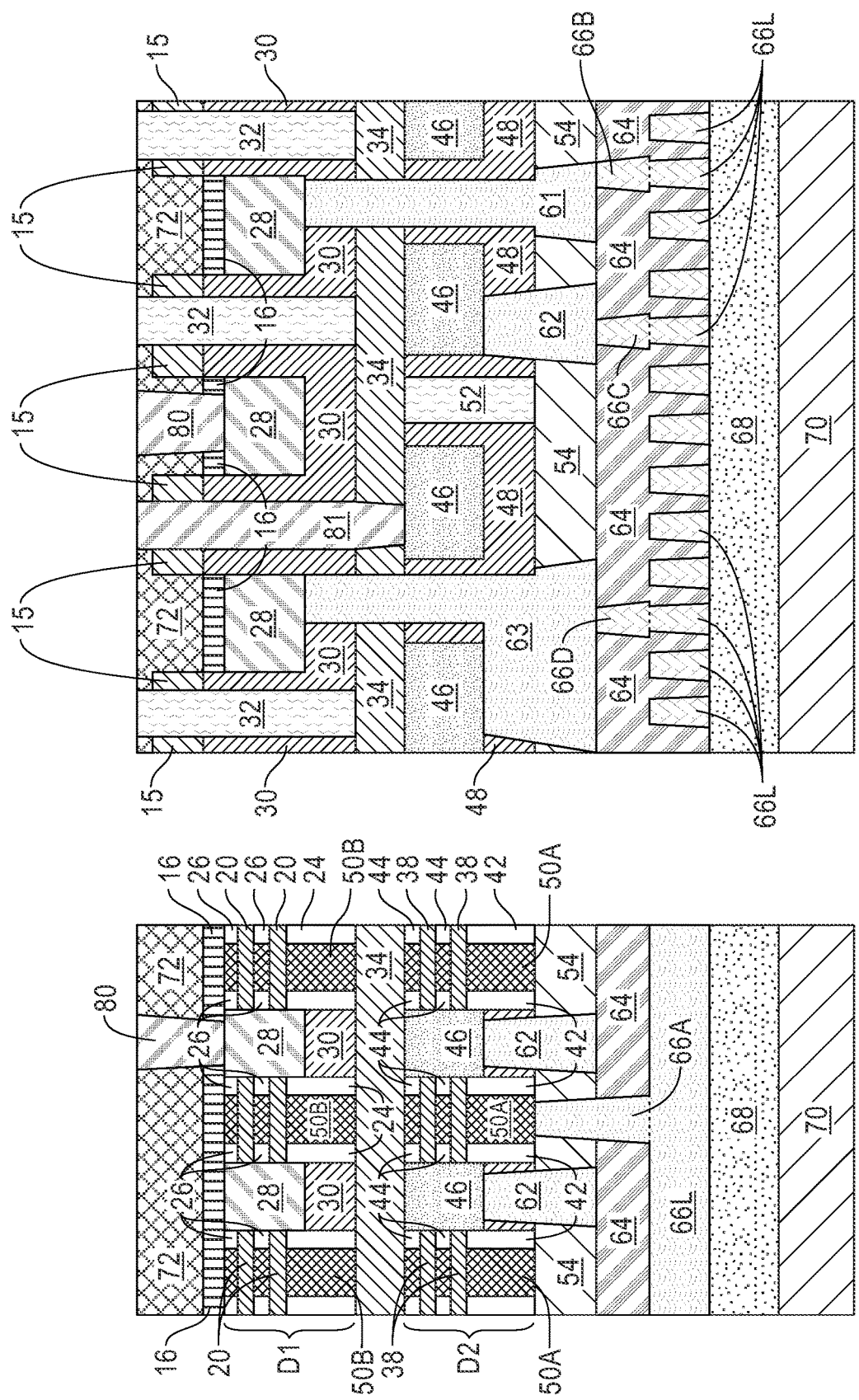
FIG. 21B Section Y
FIG. 21A Section X

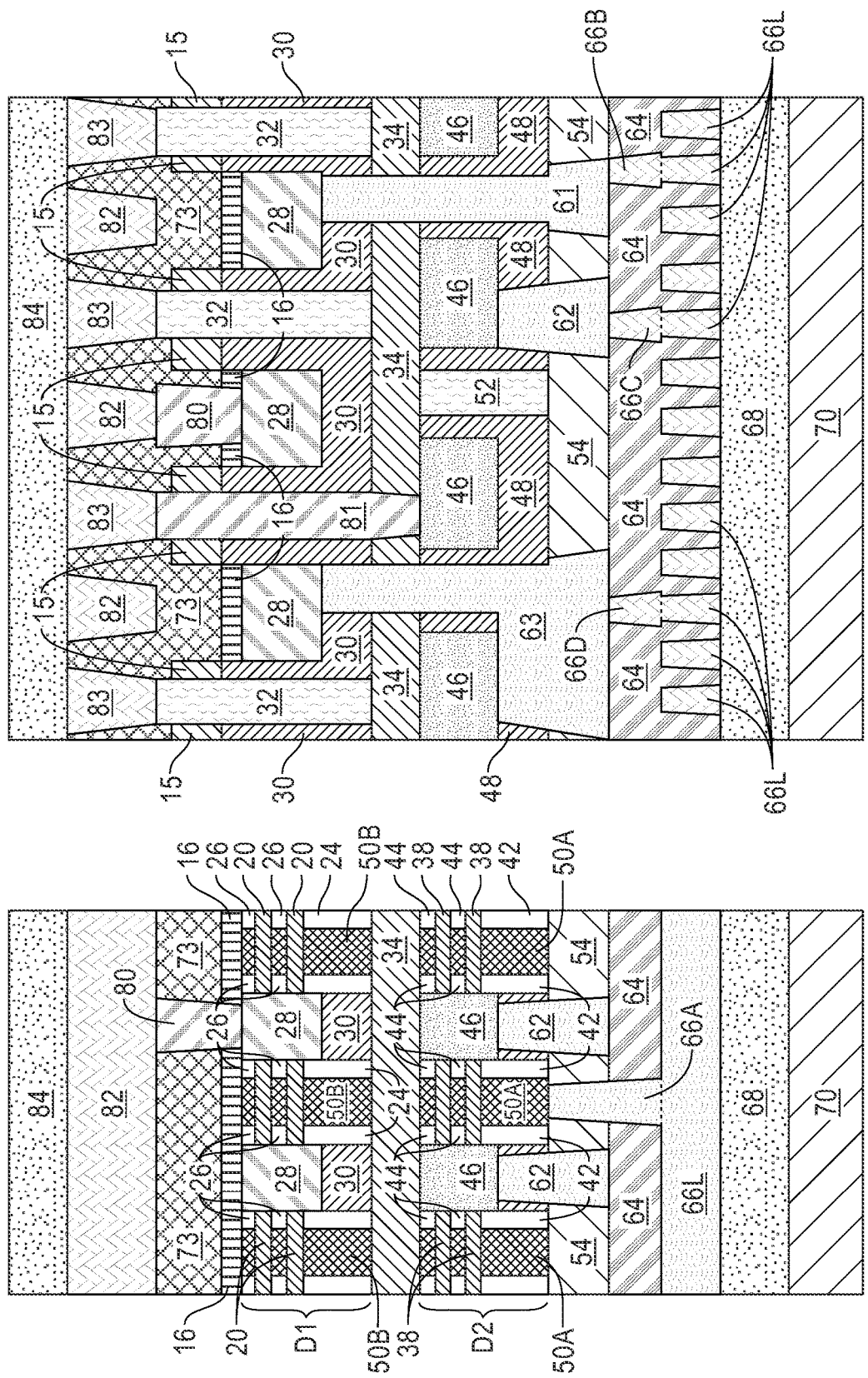
FIG. 22A Section X
FIG. 22B Section Y

STACKED FETS WITH CONTACT PLACEHOLDER STRUCTURES

BACKGROUND

The present application relates to semiconductor technology, and more particularly to a semiconductor structure that includes stacked field effect transistors (FETs) having flexible signal and power routing.

Integrated circuitry continues to scale to smaller feature dimensions and higher transistor densities. Three-dimensional (3D) integration increases transistor density by exploiting the Z-dimension, building upwards as well as building laterally outwards in the X and Y dimensions. Another development that can be used for increasingly densely packed semiconductor devices is to establish electrical connections between semiconductor devices using both front side and backside interconnections. Regardless of whether an integrated circuit includes one device layer (or equivalently "device region") or multiple device layers, using backside interconnections can improve various aspects of semiconductor device configuration and performance, particularly with respect to density constraints.

SUMMARY

The present application provides a semiconductor structure having flexible signal and power routing. The semiconductor structure includes a second FET device stacked over a first FET device, wherein the source/drain regions of the second FET device are staggered relative to the source/drain regions of the first FET device and wherein front side contact placeholder structures are located in the device regions including the first and second FET devices. Note that the staggering of the first source/drain regions and the second source/drain regions is not 100% staggering; some overlap (in a vertical plane from the first and second source/drain regions) of these stacked source/drain regions can occur.

In one aspect of the present application, a semiconductor structure is provided. In one embodiment, the semiconductor structure includes a first FET device region including a plurality of first FETs, each first FET of the plurality of first FETs includes a first source/drain region located on each side of a functional gate structure. A second FET device region is stacked above the first FET device region and includes a plurality of second FETs, each second FET of the plurality of second FETs includes a second source/drain region located on each side of a functional gate structure. The structure further includes at least one first front side contact placeholder structure located adjacent to one of the first source/drain regions of at least one of the first FETs, and at least one second front side contact placeholder structure located adjacent to at least one of the second source/drain regions of at least one of the second FETs. The presence of the first and second front side contact placeholder structures provides design flexibility in the structure.

In embodiments of the present application, a middle portion of each first source/drain region is staggered relative to a middle portion of each second source/drain region. In such embodiments, an end portion of each first source/drain region can overlap an end portion of each second source/drain region; this helps to reduce the cell height. In such embodiments, the at least one first front side contact placeholder structure is staggered relative to the at least one second front side contact placeholder structure, and the at least one first front side contact placeholder structure is located beneath one of the second source/drain regions of one of the second FETs, and the at least one second front side contact placeholder structure is located above one of the first source/drain regions of the one of the first FETs. These embodiments enable flexible signal and backside power routing.

In some embodiments of the present application, the structure further includes a stacked FET device separating layer separating the first FET device region from the second FET device region. The stacked FET device separating layer provides device isolation between the first and second FET device regions.

In some embodiments of the present application, the structure further includes a bottom dielectric isolation layer located beneath each of the first source/drain regions and present in the first FET device region. The bottom dielectric isolation layer adds electrical isolation to the structure and prevents unwanted parasitic capacitance from forming.

In some embodiments of the present application, the at least one first front side contact placeholder structure contacts a VSS power source and the VSS power source is connected to a backside power distribution network. This enables a connection to the backside of the structure.

In some embodiments of the present application, the structure further includes signal lines located above the second FET device region, wherein the signal lines are in contact with an additional back-end-of-the-line (BEOL) structure. This enables a connection to the front side of the structure.

In some embodiments of the present application, a carrier wafer is located on the additional BEOL structure.

In some embodiments of the present application, another of the second source/drain regions is wired to a VDD power source by a backside source/drain contact structure that extends from the second FET device region and entirely through the first FET device region.

In some embodiments of the present application, another of the first source/drain regions is wired to a VSS power source by a backside source/drain contact structure that extends into the first FET device region.

In some embodiments of the present application, another of the first source/drain regions and another of the second source/drain regions are electrically connected by a shared source/drain contact structure.

In some embodiments of the present application, the at least one first front side contact placeholder structure and the at least one second front side contact placeholder structure both include a placeholder dielectric material. The placeholder dielectric material can be designed to exert stress on nearby structures.

In some embodiments of the present application, at least one of the source/drain regions is wired to a signal line located above the second FET device region by a first source/drain region front side contact structure and a metal via.

In some embodiments of the present application, at least one of the second source/drain regions is wired to a signal line located above the second FET device region by a second source/drain region front side contact structure and a metal via.

In some embodiments of the present application, each of the first source/drain regions is located on a surface of a bottom dielectric isolation layer, and each of the second source/drain regions is located on a surface of a stacked FET device separating layer that is positioned between the first FET device region and the second FET device region.

In some embodiments of the present application, the at least one first contact placeholder structure extends through a shallow trench isolation region and a first interlayer dielectric material layer, the first interlayer dielectric material layer is located laterally adjacent to, and above, each first source/drain region, and the at least one second front side contact placeholder structure extends through a second interlayer dielectric material layer, the second interlayer dielectric material layer is located laterally adjacent to, and above, each second source/drain region.

In some embodiments of the present application, the first FETs and the second FETs are nanosheet containing FETs in which the functional gate structure wraps around a semiconductor channel material nanosheet that is present in each of the first FET device region and the second FET device region.

In some embodiments of the present application, the first FETs are of a first conductivity type and the second FETs are of a second conductivity type, and wherein the second conductivity type differs from the first conductivity type.

In some embodiments of the present application, the first FETs are of a first conductivity type and the second FETs are of a second conductivity type, and wherein the second conductivity type is of a same conductivity as the first conductivity type.

In another aspect of the present application, a method of forming a semiconductor structure is provided. The method of the present application will become more apparent by referring to the drawings and detail description of the present application that follow.

BRIEF DESCRIPTION OF THE DRAWINGS

FIGS. 4A-4B are cross sectional views of the exemplary semiconductor structure shown in FIGS. 3A-3B, respectively, after forming a stacked FET device separating layer, and forming a material stack of alternating second sacrificial semiconductor material layers and second semiconductor channel material layers on the stacked FET device separating layer.

FIGS. 5A-5B are cross sectional views of the exemplary semiconductor structure shown in FIGS. 4A-4B, respectively, after forming a plurality of second sacrificial gate structures straddling over different portions of the material stack, patterning the material stack utilizing at least the second sacrificial gate structures as a pattern mask to provide a plurality of second nanosheet-containing stacks of alternating second sacrificial semiconductor material nanosheets and second semiconductor channel material nanosheets, forming a second source/drain region extending outward from each second semiconductor channel material nano sheet, and forming a second front side ILD material layer.

FIGS. 6A-6B are cross sectional views of the exemplary semiconductor structure shown in FIGS. 5A-5B, respectively, after removing each second sacrificial gate structure and each first sacrificial gate structure, removing each of the second sacrificial semiconductor material nanosheets and the first sacrificial semiconductor material nanosheets so as to suspend each second semiconductor channel material nanosheet and each first semiconductor channel material nanosheet and forming a functional gate structure including a first functional gate structure portion wrapping around the suspended first semiconductor channel material nanosheets, and a second functional gate structure portion wrapping around the suspended second semiconductor channel material nanosheets.

FIGS. 8A-8B are cross sectional views of the exemplary semiconductor structure shown in FIGS. 7A-7B, respectively, after forming a middle-of-the-line (MOL) dielectric material layer having contact openings that physically expose a first set of the second front side contact placeholder structures.

FIGS. 10A-10B are cross sectional views of the exemplary semiconductor structure shown in FIGS. 9A-9B, respectively, after forming source/drain contact openings that physically expose a first set of the second source/drain regions.

FIGS. 11A-11B are cross sectional views of the exemplary semiconductor structure shown in FIGS. 10A-10B, respectively, after forming front side source/drain contain structures in the various contact openings as well as the openings provided by the etching in FIGS. 8A-8B FIGS. 12A-12B are cross sectional views of the exemplary semiconductor structure shown in FIGS. 11A-11B, respectively, after forming a back-end-of-the-line (BEOL) dielectric material layer and M1 signal lines.

FIGS. 13A-13B are cross sectional views of the exemplary semiconductor structure shown in FIGS. 12A-12B, respectively, after forming an additional BEOL structure, and a carrier wafer.

FIGS. 14A-14B are cross sectional views of the exemplary semiconductor structure shown in FIGS. 13A-13B, respectively, after wafer flipping so as to allow backside processing of the structure.

FIGS. 15A-15B are cross sectional views of the exemplary semiconductor structure shown in FIGS. 14A-14B, respectively, after removing a first semiconductor material layer of the semiconductor substrate to physically expose an etch stop layer of the semiconductor substrate.

FIGS. 16A-16B are cross sectional views of the exemplary semiconductor structure shown in FIGS. 15A-15B, respectively, after removing the etch stop layer and a second semiconductor material layer of the semiconductor substrate.

FIGS. 17A-17B are cross sectional views of the exemplary semiconductor structure shown in FIGS. 16A-16B, respectively, after forming a backside ILD material layer.

FIGS. 18A-18B are cross sectional views of the exemplary semiconductor structure shown in FIGS. 17A-17B, respectively, after forming a patterned mask on the backside ILD material layer, wherein the patterned mask has an opening that physically exposes one of the first front side contact placeholder structures, FIGS. 19A-19B are cross sectional views of the exemplary semiconductor structure shown in FIGS. 18A-18B, respectively, after etching through the structure utilizing the pattern mask as an etch mask to physically expose a surface of one of the second source/drain regions.

FIGS. 20A-20B are cross sectional views of the exemplary semiconductor structure shown in FIGS. 19A-19B, respectively, after forming a backside first source/drain contact opening to one of the first source/drain regions.

FIGS. 21A-21B are cross sectional views of the exemplary semiconductor structure shown in FIGS. 20A-20B, respectively, after forming backside source/drain contact structures in the first source/drain contact opening as well as the opening provided by the etch performed in FIGS. 19A-19B.

FIGS. 22A-22B are cross sectional views of the exemplary semiconductor structure shown in FIGS. 21A-21B, respectively, after forming backside power rails and a backside power distribution network.

DETAILED DESCRIPTION

Figure 1:
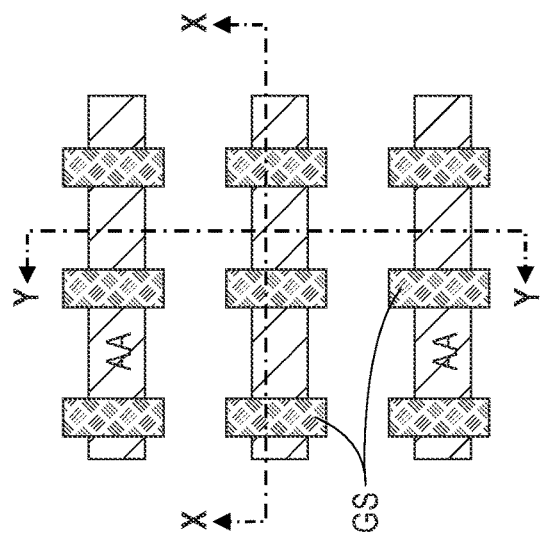
FIG. 1 is a top down view illustrating a device layout that can be employed in accordance with an embodiment of the present application.

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

Referring first to FIG. 1, there is illustrated a top down view of an exemplary semiconductor device layout that can be employed in accordance with an embodiment of the present application. The illustrated semiconductor device layout includes various active device regions, AA, that are spaced apart from each other by a non-active device region (not specifically labeled in the drawing). Within each active device region, AA, there is present a plurality of gate structures, GS, which are oriented parallel to each other. The semiconductor device layout illustrated in FIG. 1 will be used to describe a stacked nanosheet FET device in accordance with an embodiment of the present application. Although a stacked nanosheet device is described and illustrated, the present application works for other stacked FET devices including, for example, stacked planar FET devices, stacked FinFET devices, or stacked nanowire devices. Mixed stacked devices, e.g., a FinFET device and a nanosheet device, are also contemplated.

FIG. 1 includes a cut X-X which is through the middle active device region, AA, depicted in FIG. 1. FIG. 1 also includes cut Y-Y which is perpendicular to X-X and through a source/drain region that is present in each of the active device regions, AA, depicted in FIG. 1. Cut Y-Y is between a neighboring pair of gate structures that are present in each of the active device regions, AA. In the present application, FIGS. 2A, 3A, 4A, 5A, 6A, 7A, 8A, 9A, 10A, 11A, 12A, 13A, 14A, 15A, 16A, 17A, 18A, 19A, 20A, 21A and 22A illustrate an exemplary semiconductor structure through various processing steps of the present application and through cut X-X shown in FIG. 1 FIGS. 2B, 3B, 4B, 5B, 6B, 7B, 8B, 9B, 10B, 11B, 12B, 13B, 14B, 15B, 16B, 17B, 18B, 19B, 20B, 21B and 22B illustrate the exemplary semiconductor structure through various processing steps of the present application and through cut Y-Y shown in FIG. 1.

Figure 2B:
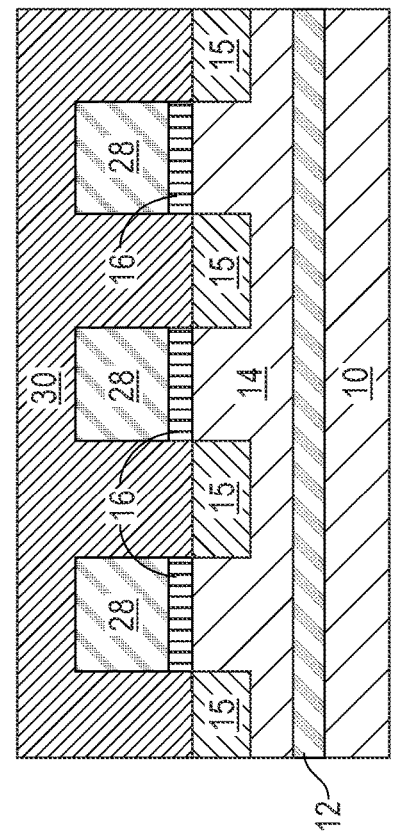
FIGS. 2A-2B are cross sectional views of an exemplary semiconductor structure through X-X and Y-Y shown in FIG. 1, respectively, that can be employed in the present application, the exemplary semiconductor structure includes a semiconductor substrate, a bottom dielectric isolation layer located on the semiconductor substrate, a plurality of first nanosheet-containing stacks of alternating first sacrificial semiconductor material nanosheets and first semiconductor channel material nanosheets located on the bottom dielectric isolation layer, a first sacrificial gate structure straddling each of the first nanosheet-containing stacks, a first source/drain region extending outward from each first semiconductor channel material nanosheets, and a first front side interlayer dielectric (ILD) material layer located on top of the first source/drain region.
Figure 2A:
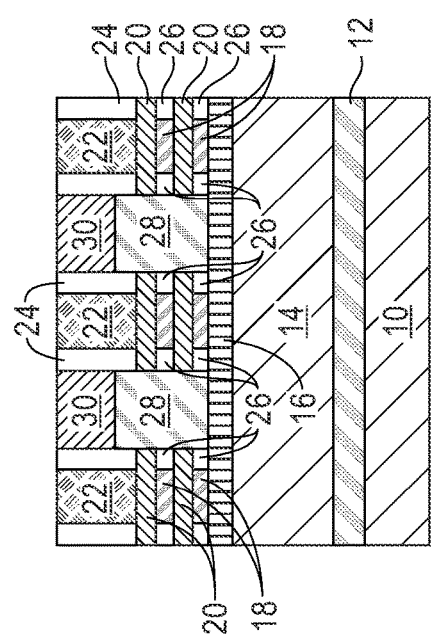

Referring now to FIGS. 2A-2B, there are illustrated an exemplary semiconductor structure through X-X and Y-Y shown in FIG. 1, respectively, that can be employed in the present application. The exemplary semiconductor structure includes a semiconductor substrate 10/12/14, a bottom dielectric isolation layer 16 located on the semiconductor substrate 10/12/14, a plurality of first nanosheet-containing stacks (by way of one example FIG. 2A illustrates three first nanosheet-containing stacks) of alternating first sacrificial semiconductor material nanosheets 18 and first semiconductor channel material nanosheets 20 located on the bottom dielectric isolation layer 16, a first sacrificial gate structure 22 straddling each of the first nanosheet-containing stacks 18/20, a first source/drain region 28 extending outward from each first semiconductor channel material nanosheet 20, and a first front side interlayer dielectric (ILD) material layer 30 located on top of the first source/drain region 28. The semiconductor substrate includes a first semiconductor material layer 10, an etch stop layer 12 and a second semiconductor material layer 14.

The exemplary structure also includes a shallow trench isolation region 15 located laterally adjacent to a non-etch portion of the second semiconductor material layer 14 of the semiconductor substrate, a first gate spacer 24 located laterally adjacent to each sacrificial gate structure 22, and a first inner spacer 26 located laterally adjacent to end walls of each first sacrificial semiconductor material nanosheet 18. The first inner spacer 26 is located beneath each of the first semiconductor channel material nanosheets 20.

The first semiconductor material layer 10 of the semiconductor substrate is composed of a first semiconductor material having semiconducting properties. Examples of first semiconductor materials that can be used to provide the first semiconductor material layer 10 include, but are not limited to, silicon (Si), a silicon germanium (SiGe) alloy, a silicon germanium carbide (SiGeC) alloy, germanium (Ge), III/V compound semiconductors or II/VI compound semiconductors. The second semiconductor material layer 14 is composed of a second semiconductor material. The second semiconductor material that provides the second semiconductor material layer 14 can be compositionally the same as, or compositionally different from, the first semiconductor material that provides the first semiconductor material layer 10. In some embodiments of the present application, the etch stop layer 12 can be composed of a dielectric material such as, for example, silicon dioxide and/or boron nitride. In other embodiments of the present application, the etch stop layer 12 is composed of a semiconductor material that is compositionally different from the semiconductor material that provides both the first semiconductor material layer 10 and the second semiconductor material layer 14.

In one example, the first semiconductor material layer 10 is composed of silicon, the etch stop layer 12 is composed of silicon dioxide, and the second semiconductor material layer 14 is composed of silicon. Such a semiconductor substate including silicon/silicon dioxide/silicon can be referred to as a silicon-on-insulator (all) substrate. In another example, the first semiconductor material layer 10 is composed of silicon, the etch stop layer 12 is composed of silicon germanium, and the second semiconductor material layer 14 is composed of silicon. Such a semiconductor substate including silicon/silicon germanium/silicon can be referred to as a bulk semiconductor substrate.

The shallow trench isolation region 15 is composed of any trench dielectric material such as, for example, silicon oxide. In some embodiments, a trench dielectric material such as, for example, SiN, can be present along a sidewall and a bottom wall of the trench dielectric material. The shallow trench isolation region 15 can have a topmost surface that is coplanar with a topmost surface of the non-etched portion of the second semiconductor material layer 14.

As mentioned above, each first nanosheet-containing stack (each stack is a vertical stack of nanosheets) includes alternating first sacrificial semiconductor material nanosheets 18 and second semiconductor channel material nanosheets 20 stacked one atop the another. Within each first nanosheet-containing stack there can be 'n' first semiconductor channel material nanosheets 20 and "n or n+1" first sacrificial semiconductor material nanosheets 18; the "n+1" embodiment is not shown, wherein n is an integer starting at one. In the illustrated embodiment, each vertical nanosheet-containing stack includes "n" first sacrificial semiconductor material nanosheets 18 and "n" first semiconductor channel material nanosheets 20. By way of one example, each first nanosheet-containing stack includes two first semiconductor channel material nanosheets 20 and two first sacrificial semiconductor material nanosheets 18.

Each first sacrificial semiconductor material nanosheet 18 is composed of a third semiconductor material, while each first semiconductor channel material nanosheet 20 is composed of a fourth semiconductor material that is compositionally different from the third semiconductor material. The third and fourth semiconductor materials include one of the semiconductor materials mentioned above for the first semiconductor material layer 10. In some embodiments, the first semiconductor channel material nanosheets 20 are composed of a fourth semiconductor material capable of providing high channel mobility for NFET devices. In other embodiments, the first semiconductor channel material nanosheets 20 are composed of a fourth semiconductor material capable of providing high channel mobility for PFET devices.

Each first sacrificial semiconductor material nanosheet 18 has a first width and each first semiconductor channel material nanosheets 20 has a second width that is greater than the first width. In one example, the first width is from 10 nm to 100 nm, and the second width is from 20 nm to 130 nm. Each first sacrificial semiconductor material nanosheet 18 and each first semiconductor channel material nanosheets 20 have a same length. In one example, the length of each first sacrificial semiconductor material nanosheet 18 and each first semiconductor channel material nanosheets 20 is from 10 nm to 130 nm. The vertical height of each first sacrificial semiconductor material nanosheet 18 and each first semiconductor channel material nanosheets 20 is within a range from 4 nm to 20 nm. The vertical height of each first sacrificial semiconductor material nanosheet 18 can be equal to, greater than, or less than, the vertical height of each first semiconductor channel material nanosheet 20.

The first sacrificial gate structure 22 includes at least a sacrificial gate material. In some embodiments, the first sacrificial gate structure 22 can include a sacrificial gate dielectric material. The sacrificial gate dielectric material can be composed of a dielectric material such as, for example, silicon dioxide. The sacrificial gate material can include, but is not limited to, polysilicon, amorphous silicon, amorphous silicon germanium, tungsten, titanium, tantalum, aluminum, nickel, ruthenium, palladium, platinum, or alloys of such metals.

The first gate spacer 24 is composed of a gate spacer dielectric material. Examples of gate spacer dielectric materials that can be used in providing the first gate spacer 24 include, but are not limited to, SiN, SiBCN, SiOCN or SiOC. The bottom dielectric isolation layer 16 is composed of one of the gate spacer dielectric materials mentioned above for the first gate spacer 24.

The bottom dielectric isolation layer 16 and first gate spacer 24 are formed at the same time, thus they are composed of a compositionally same gate spacer dielectric material. The bottom dielectric isolation layer 16 can have a thickness from 5 nm to 50 nm; although other thicknesses for the bottom dielectric isolation layer 16 are contemplated and can be employed as the thickness of the bottom dielectric isolation layer 16.

The first inner spacer 26 is composed one of the gate spacer dielectric materials mentioned above for first gate spacer 24. The gate spacer dielectric material that provides the first inner spacer 26 can be compositionally the same as, or compositionally different from, the gate dielectric spacer material that provides the first gate spacer 24.

The first source/drain region 28 is composed of a semiconductor material and a first dopant. As used herein, a "source/drain or S/D" region can be a source region or a drain region depending on subsequent wiring and application of voltages during operation of the field effect transistor (FET). As is known, source/drain regions are located on each side of a gate structure. The semiconductor material that provides the first source/drain region 28 can include one of the semiconductor materials mentioned above for the first semiconductor material layer 10 of the semiconductor substrate. The semiconductor material that provides the first source/drain region 28 can be compositionally the same as, or compositionally different from, each first semiconductor channel material nanosheet 20. The first dopant that is present in the first source/drain region 28 can be either a p-type dopant or an n-type dopant. The term "p-type" refers to the addition of impurities to an intrinsic semiconductor that creates deficiencies of valence electrons. In a silicon-containing semiconductor material, examples of p-type dopants, i.e., impurities, include, but are not limited to, boron, aluminum, gallium, phosphorus and indium. "N-type" refers to the addition of impurities that contributes free electrons to an intrinsic semiconductor. In a silicon containing semiconductor material, examples of n-type dopants, i.e., impurities, include, but are not limited to, antimony, arsenic and phosphorous. In one example, the first source/drain region 28 can have a dopant concentration of from $4 \times 10^{20}$ atoms/cm$^3$ to $3 \times 10^{21}$ atoms/cm$^3$. As is shown, the first source/drain region 28 contacts the bottom dielectric isolation layer 16 (See, for example, FIGS. 2A-2B).

The first front side ILD material layer 30 can be composed of a dielectric material including, for example, silicon oxide, silicon nitride, undoped silicate glass (USG), fluorosilicate glass (FSG), borophosphosilicate glass (BPSG), a spin-on low-k dielectric layer, a chemical vapor deposition (CVD) low-k dielectric layer or any combination thereof. The term "low-k" as used throughout the present application denotes a dielectric material that has a dielectric constant of less than 4.0. All dielectric constants mentioned herein are measured relative to a vacuum unless otherwise is stated.

The exemplary structure shown in FIGS. 2A-2B can be formed utilizing conventional nanosheet stack forming processes that are well known to those skilled in the art. In one example, the exemplary structure shown in FIGS. 2A-2B can be formed by first forming a sacrificial placeholder material layer (not shown) on a surface of the second semiconductor material layer 14. The sacrificial placeholder material layer can include a semiconductor material that is compositionally different from the second semiconductor material that provides the second semiconductor material layer 14, the third semiconductor material that provides each first sacrificial semiconductor material nanosheet 18, and the fourth semiconductor material that provides each first semiconductor channel material nanosheet 20. The forming of the placeholder material layer can include an epitaxial growth process or any other deposition process such as, for example, chemical vapor deposition (CVD), plasma enhanced chemical vapor deposition (PECVD), physical vapor deposition (PVD) atomic layer deposition (ALD) or evaporation. After forming the placeholder material layer, a material stack of alternating layers of the third and fourth semiconductor materials are formed by epitaxial growth or by using one of the deposition processes mentioned above for forming the placeholder material layer. Lithography and etching can then be used to pattern the material stack and the placeholder material layer into a multilayered material structure that includes a remaining portion of the placeholder material layer and a remaining portion of the material stack.

The terms "epitaxial growth" or "epitaxially growing" means the growth of a second semiconductor material on a growth surface of a first semiconductor material, in which the second semiconductor material being grown has the same crystalline characteristics as the first semiconductor material. In an epitaxial deposition process, the chemical reactants provided by the source gases are controlled and the system parameters are set so that the depositing atoms arrive at the growth surface of the first semiconductor material with sufficient energy to move around on the growth surface and orient themselves to the crystal arrangement of the atoms of the growth surface. Examples of various epitaxial growth process apparatuses that can be employed in the present application include, e.g., rapid thermal chemical vapor deposition (RTCVD), low-energy plasma deposition (LEPD), ultra-high vacuum chemical vapor deposition (UHVCVD), atmospheric pressure chemical vapor deposition (APCVD) and molecular beam epitaxy (MBE). The temperature for epitaxial deposition typically ranges from 550° C. to 900° C. Although higher temperature typically results in faster deposition, the faster deposition may result in crystal defects and film cracking.

First sacrificial gate structure 22 is then formed on this multilayered material stack by depositing blanket layers of a sacrificial gate dielectric material (if the same is present), and a sacrificial gate material. The depositing of the blanket layers of sacrificial gate material, and, if present, sacrificial gate dielectric material includes, but is not limited to, CVD, PECVD, PVD, ALD or any combination of such deposition processes. After forming these blanket layers, a patterning process (including lithography and etching) is used to convert the blanket layers of the sacrificial gate dielectric material (if present) and the sacrificial gate dielectric material into the sacrificial gate structure 22. The etch can include dry etching and/or wet chemical etching. Dry etching can include a reactive ion etch (RIE), a plasma etch or an ion beam etch (IBE). During this etch, the second semiconductor material layer 14 can be etched and the shallow trench isolation region 15 can be formed utilizing techniques well-known to those skilled in the art. Next, the placeholder material layer that is present in the multilayered material stack is removed utilizing an etching process that is selective in removing the placeholder material layer. A space (or gap) is formed between a bottommost sacrificial semiconductor material layer of the multilayered material stack and the second semiconductor material layer 14. The structure is not free floating, but is held in place by the first sacrificial gate structure 22. Next, first gate spacer 24 and the bottom dielectric isolation layer 16 are formed simultaneously. Notably, the first gate spacer 24 and the bottom dielectric isolation layer 16 are formed by deposition of a gate dielectric spacer material, followed by a spacer etch. The deposition fills in the gap and forms the bottom dielectric isolation layer 16. In embodiments, the first gate spacer 24 can be I-shaped, and have a topmost surface that is coplanar with a topmost surface of the first sacrificial gate structure 22.

After forming the first gate spacer 24 and the bottom dielectric isolation layer 16, the multilayered material stack including alternating layers of the third and fourth semiconductor materials is etched in which the first sacrificial gate structure 22 and the first gate spacer 24 serve as an etch mask. The etch stops on the bottom dielectric isolation layer 16. In the present application, the non-etched (i.e., remaining) portion of each layer of third semiconductor material is referred to as the first sacrificial semiconductor material nanosheet 18, and the non-etched (i.e., remaining) portion of each layer of fourth semiconductor material is referred to as the first semiconductor channel material nanosheet 20. Next, first inner spacer 26 are formed. The first inner spacer 26 is formed by first recessing each of the sacrificial semiconductor material nanosheets to form an inner spacer gap adjacent to the ends of each first sacrificial semiconductor material nanosheet 18. After this recessing step, the remaining (i.e., recessed) first sacrificial semiconductor material nanosheets 18 have a reduced lateral width as compared to the width of the original sacrificial semiconductor material nanosheets. The recessing includes a lateral etching process that is selective in removing the sacrificial semiconductor material nanosheets relative to the first semiconductor channel material nanosheets 20. Next, first inner spacers 26 are formed in the inner spacer gap by conformal deposition of a spacer dielectric material, followed by isotropic etching. Next, the first source/drain regions 28 are formed by epitaxial growth as defined above, and thereafter the first front side ILD material layer 30 is formed on top of the source/drain region by deposition, followed by a planarization process.

Figure 3B:
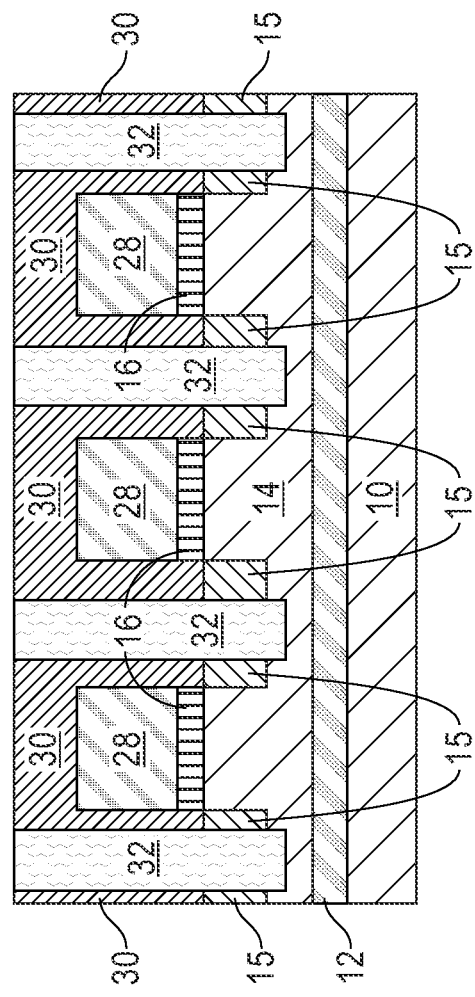
FIGS. 3A-3B are cross sectional views of the exemplary semiconductor structure shown in FIGS. 2A-2B, respectively, after forming a plurality of first front side contact placeholder structures.
Figure 3A:
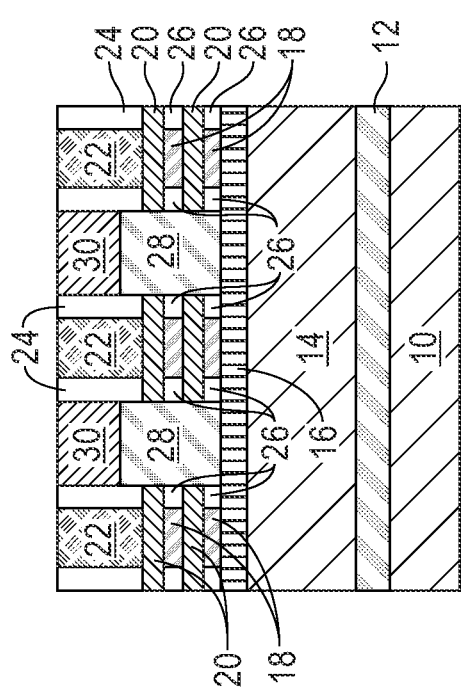

Referring now to FIGS. 3A-3B, there are illustrated the exemplary semiconductor structure shown in FIGS. 2A-2B, respectively, after forming a plurality of first front side contact placeholder structures 32. The first front side contact placeholder structures 32 are formed laterally adjacent to each first source/drain region 28 and each of first front side contact placeholder structure 32 extends through the first ILD material layer 30, the shallow trench isolation region 15 and into a portion of the second semiconductor material layer 14. Each of first front side contact placeholder structure 32 thus contacts a sub-surface of the second semiconductor material layer 14. The term "sub-surface" is used throughout the present application to denote a surface of a material that is located between a topmost surface of the material and a bottommost surface of the material.

The first front side contact placeholder structures 32 are composed of any suitable placeholder dielectric material such as, for example, SiC, SiCO, and combinations thereof. The placeholder dielectric material that provides the front side contact placeholder structures 32 can be designed to exert stress on nearby structures.

Each first front side contact placeholder structure 32 can be formed by first forming an opening in the exemplary structure which passes through the first ILD material layer 30 and the shallow trench isolation region 15 and physically exposes the sub-surface of the second semiconductor material layer 14. The opening can be formed by lithography and etching (such as, for example, RIE). After forming the opening, the opening is filled with a placeholder dielectric material and/or metal utilizing a deposition process. A planarization process such as, for example, chemical mechanical polishing (CMP) can follow the deposition of the placeholder dielectric material and/or metal. Each first front side contact placeholder structure 32 has a topmost surface that is coplanar with a topmost surface of the first ILD material layer 30. The number of first front side contact placeholder structures 32 and is not limited to four as is shown in FIGS. 3A-3B.

Referring now FIGS. 4A-4B, there are illustrated the exemplary semiconductor structure shown in FIGS. 3A-3B, respectively, after forming a stacked FET device separating layer 34, and forming a material stack 36L/38L of alternating second sacrificial semiconductor material layers 36L and second semiconductor channel material layers 38L on the stacked FET device separating layer 34. The stacked FET device separating layer 34 includes a dielectric material layer such as, for example, silicon dioxide, tetraethylorthosilicate (TEOS), fluorinated tetraethylorthosilicate (FTEOS), and combinations thereof. The stacked FET device separating layer 34 is typically deposited on the exemplary structure shown in FIGS. 3A-3B.

The material stack 36L/38L is formed by an epitaxial process as defined above, followed by lithographic patterning. Each second sacrificial semiconductor material layer 36L is composed of a fifth semiconductor material, and each second semiconductor channel material layer 38L is composed of a sixth semiconductor material, wherein the sixth semiconductor material is compositionally different from the fifth semiconductor material layer. The fifth semiconductor material is typically compositionally the same as the third semiconductor material used in providing each first sacrificial semiconductor material nanosheet 18, while the sixth semiconductor material can be compositionally the same as, or compositionally different from, the fourth semiconductor material that provides each first semiconductor channel material nanosheet 20. In one example, each first semiconductor channel material nanosheet 20 is composed of a fourth semiconductor material suitable for use with an NFET, while each second semiconductor channel material layer 38L is composed of a sixth semiconductor material suitable for use with a PFET device. The material stack 36L/38L can include 'm' second semiconductor channel material layers 38L and "m or m+1" second sacrificial semiconductor material layers 36L; the "m+1" embodiment is not shown, wherein m is an integer starting from one. In the illustrated embodiment, each material stack 36L/38L includes "m" second sacrificial semiconductor material layers 36L and "m" second semiconductor channel material layers 38L. By way of one example, each material stack 36L/38L includes two second semiconductor channel material layers 38L and two second sacrificial semiconductor material layers 36L.

Referring now to FIGS. 5A-5B, there are illustrated the exemplary semiconductor structure shown in FIGS. 4A-4B, respectively, after forming a plurality of second sacrificial gate structures 40 straddling over different portions of the material stack 36L/38L, patterning the material stack 36L/38L utilizing at least the second sacrificial gate structures 40 as a pattern mask to provide a plurality of second nanosheet-containing stacks of alternating second sacrificial semiconductor material nanosheets 36 and second semiconductor channel material nanosheets 38, forming a second source/drain region 46 extending outward from each second semiconductor channel material nanosheet 38, and forming a second front side ILD material layer 48. In the present application, a second gate spacer 42 is formed after forming the second sacrificial gate structures 40, and the second sacrificial gate structures 40 and the second gate spacers 42 are employed as a combined etch mask. In this embodiment, and after forming the second nanosheet-containing stacks, second inner spacer 44 is formed at the end walls of each second sacrificial semiconductor material nanosheet 36L The second sacrificial gate structures 40 include materials as mentioned above for the first sacrificial gate structures 22. The second gate spacer 42 and the second inner dielectric spacer 44 include materials as mentioned above for the first gate spacer 24 and first inner spacer 26, respectively. The second source/drain regions 46 include a semiconductor material and a second dopant. The semiconductor material that provides the second source/drain regions 46 can be compositionally the same as, or compositionally different from, the semiconductor material that provides the first source/drain regions 28. The second dopant can be of a same conductivity type or a different conductivity type than the first dopant mentioned above in providing the first source/drain regions 28. The second ILD material layer 40 includes one of the dielectric materials mentioned above for the first ILD material layer 30.

The nanosheet processing mentioned above in forming the exemplary structure shown in FIG. 2A-2B can be adapted and used here in providing the exemplary structure shown in FIGS. 5A-5B. In this embodiment, the remaining (non-etched) portion of each second sacrificial semiconductor material layer 36L forms a second sacrificial semiconductor material nanosheet 36 of a second nanosheet-containing stack, and the remaining (non-etched) portion of each second semiconductor channel material layer 38L forms a second semiconductor channel material nanosheet 38 of the second nanosheet-containing stack. The length, width and height of the second sacrificial semiconductor material nanosheets 36 and the second semiconductor channel material nanosheets 38 is within the ranges mentioned above for the first sacrificial semiconductor material nanosheets 18 and the first semiconductor channel material nanosheets 20, respectively.

As is shown in FIG. 5A, each second nanosheet-containing stack 36/38 is located vertically above, and aligned with, a first nanosheet-containing stack 18/20. As is shown in FIG. 5B, the second source/drain regions 46 are staggered above the first source/drain regions 28. In should be noted that in the present application there can be some overlap between the first source/drain regions 28 and the second source/drain regions 46; the middle (or central) portion of each of the first and second source/drain regions 28 and 46 are however staggered. This overlap helps reducing the cell height.

Referring now to FIGS. 6A-6B, there are illustrated the exemplary semiconductor structure shown in FIGS. 5A-5B, respectively, after removing each second sacrificial gate structure 40 and each first sacrificial gate structure 22, removing each of the second sacrificial semiconductor material nanosheets 36 and the first sacrificial semiconductor material nanosheets 18 so as to suspend each second semiconductor channel material nanosheet 38 and each first semiconductor channel material nanosheet 20 and forming a functional gate structure including a first functional gate structure portion 50B wrapping around the suspended first semiconductor channel material nanosheets 20, and a second functional gate structure portion 50A wrapping around the suspended second semiconductor channel material nanosheets 36. As is shown, first FET device region, D1 and a second FET device region, D2, are now formed each including a functional gate structure wrapped around the semiconductor channel material nanosheets that are present in the respective FET device region.

The removal of each second sacrificial gate structure 40 and each first sacrificial gate structure 22 includes an etching process that is selective in removing the material that provides the second sacrificial gate structures 40 and the first sacrificial gate structures 22, respectively. Typically, a single etch is used, but multiple etching can be used if different materials are used in providing the second sacrificial gate structures 40 and the first sacrificial gate structures 22.

The removal of each of the second sacrificial semiconductor material nano sheets 36 and the first sacrificial semiconductor material nanosheets 18 can include an etching process that is selective in removing the second sacrificial semiconductor material nanosheets 36 and the first sacrificial semiconductor material nanosheets 18 relative to the second semiconductor channel material nanosheets 38 and the first semiconductor material nanosheets 20. Typically, a single etch is used, but multiple etching can be used if different materials are used in providing second sacrificial semiconductor material nanosheets 36 and the first sacrificial semiconductor material nanosheets 18.

The functional gate structure including the first functional gate structure portion 50B and the second functional gate structure portion 50A includes at least a gate dielectric material layer and a gate electrode; the gate dielectric material layer and the gate electrode are not separately illustrated in the drawings of the present application. Note that the first functional gate structure portion 50B is typically compositionally the same as the second functional gate structure portion 50A of the functional gate structure. As is known, the gate dielectric material layer of the functional gate structure is in direct contact with each semiconductor channel material nanosheet, and the gate electrode is located on the gate dielectric material layer. In some embodiments, the gate structure includes a work function metal (WFM) layer (not shown) located between the gate dielectric material layer and the gate electrode. In other embodiments, the WFM layer is used solely as the gate electrode.

The gate dielectric material layer of the functional gate structure is composed of a gate dielectric material such as, for example silicon oxide, or a dielectric material having a dielectric constant greater than 4.0 (such dielectric materials can be referred to as a high-k gate dielectric material). Illustrative examples of high-k gate dielectric materials include metal oxides such as, for example, hafnium dioxide ($HfO_2$), hafnium silicon oxide (HfSiO), hafnium silicon oxynitride (HfSiO), lanthanum oxide ($La_2O_3$), lanthanum aluminum oxide ($LaAlO_3$), zirconium dioxide ($ZrO_2$), zirconium silicon oxide ($ZrSiO_4$), zirconium silicon oxynitride ($ZrSiO_xN_y$), tantalum oxide ($TaO_x$), titanium oxide (TiO), barium strontium titanium oxide ($BaO_6SrTi_2$), barium titanium oxide ($BaTiO_3$), strontium titanium oxide ($SrTiO_3$), yttrium oxide ($Yb_2O_3$), aluminum oxide ($Al_2O_3$), lead scandium tantalum oxide ($Pb(Sc, Ta)O_3$), and/or lead zinc niobite ($Pb(Zn, Nb)O$). The high-k gate dielectric material can further include dopants such as lanthanum (La), aluminum (Al) and/or magnesium (Mg).

The gate electrode of the functional gate structure can include an electrically conductive metal-containing material including, but not limited to tungsten (W), titanium (Ti), tantalum (Ta), ruthenium (Ru), zirconium (Zr), cobalt (Co), copper (Cu), aluminum (Al), lead (Pb), platinum (Pt), tin (Sn), silver (Ag), or gold (Au), tantalum nitride (TaN), titanium nitride (TiN), tantalum carbide ($TaC_x$), titanium carbide (TiC), titanium aluminum carbide, tungsten silicide ($WSi_2$), tungsten nitride (WN), ruthenium oxide ($RuO_2$), cobalt silicide, or nickel silicide.

In some embodiments, a WFM layer can be employed as either the electrically conductive metal-containing material that provides the gate electrode or as a separate layer that is located between the gate dielectric material prior layer and the gate electrode. The WFM layer can be used to set a threshold voltage of the FET to a desired value. In some embodiments, the WFM layer can be selected to effectuate an n-type threshold voltage shift. "N-type threshold voltage shift" as used herein means a shift in the effective work-function of the work-function metal-containing material towards a conduction band of silicon in a silicon-containing material. In one embodiment, the work function of the n-type work function metal ranges from 4.1 eV to 4.3 eV. Examples of such materials that can effectuate an n-type threshold voltage shift include, but are not limited to, titanium aluminum, titanium aluminum carbide, tantalum nitride, titanium nitride, hafnium nitride, hafnium silicon, or combinations and thereof. In other embodiments, the WFM layer can be selected to effectuate a p-type threshold voltage shift. In one embodiment, the work function of the p-type work function metal ranges from 4.9 eV to 5.2 eV. As used herein, "threshold voltage" is the lowest attainable gate voltage that will turn on a semiconductor device, e.g., transistor, by making the channel of the device conductive. The term "p-type threshold voltage shift" as used herein means a shift in the effective work-function of the work-function metal-containing material towards a valence band of silicon in the silicon containing material. Examples of such materials that can effectuate a p-type threshold voltage shift include, but are not limited to, titanium nitride, and tantalum carbide, hafnium carbide, and combinations thereof.

The functional gate structure including the first functional gate structure portion 50B and the second functional gate structure portion 50A is formed by deposition of a gate dielectric material layer, an optional WFM layer and a gate electrode layer or a gate dielectric material layer and a WFM layer, followed by a planarization process. Deposition of the gate dielectric material layer can include, CVD, PECVD, or ALD, while deposition of the WFM layer and/or the gate electrode layer can include, CVD, PECVD, PVD, ALD, or sputtering. When the material that provides the first functional gate structure portion 50B and the second functional gate structure portion 50A of the functional gate structure are different, block mask technology can be used. It should be noted that the FETs that are present in the first FET device region can be of a same conductivity type or a different conductivity type than the FETs that are present in the second FET device region.

Figures 7A, 7B:
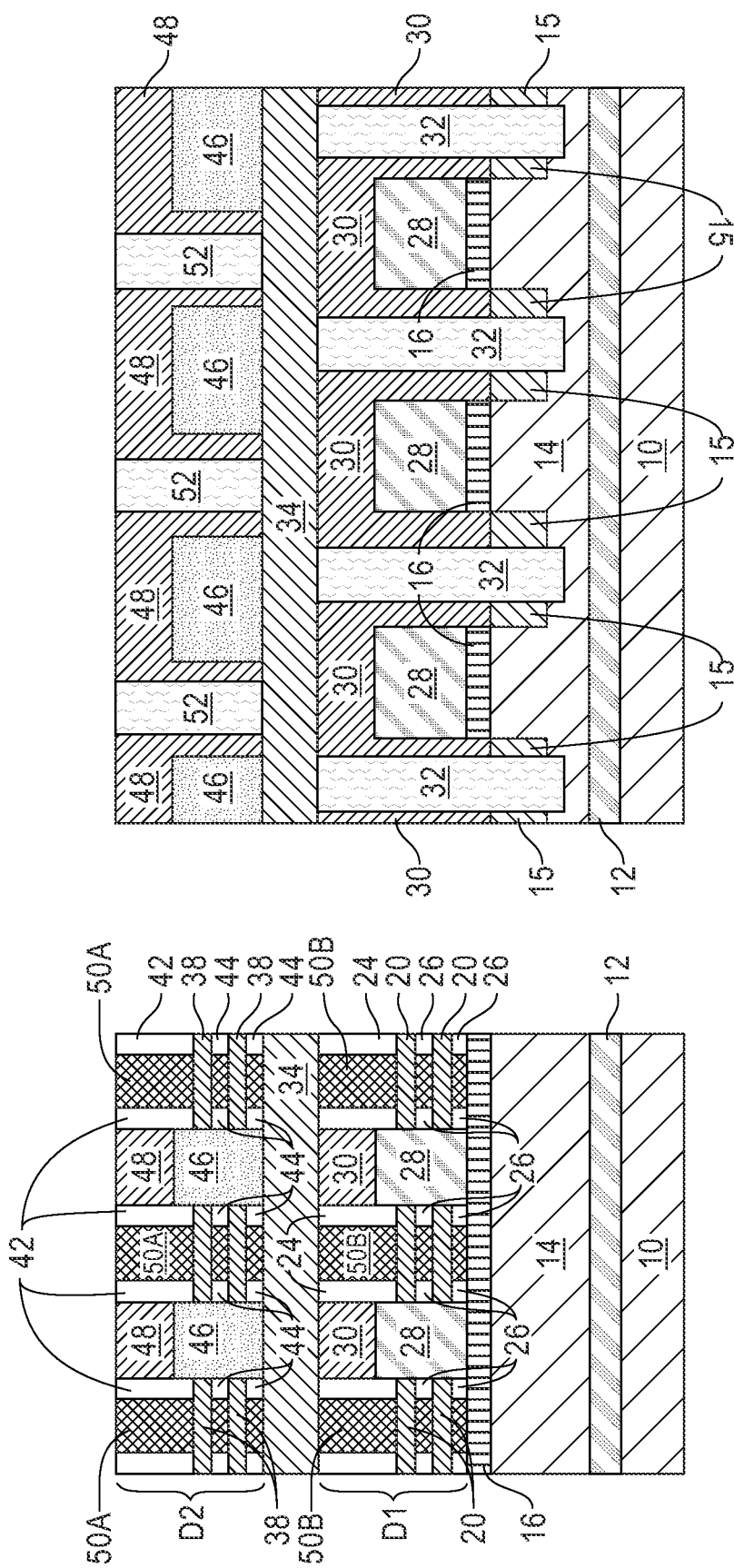
FIGS. 7A-7B are cross sectional views of the exemplary semiconductor structure shown in FIGS. 6A-6B, respectively, after forming a plurality of second front side contact placeholder structures, wherein the plurality of second front side contact placeholder structures are staggered relative to the plurality of first front side contact placeholder structures, and each first front side contact placeholder structure is located beneath one of the second source/drain regions and each second front side contact placeholder structure is located above one of the first source/drain regions.

Referring now to FIGS. 7A-7B, there are illustrated the exemplary semiconductor structure shown in FIGS. 6A-6B, respectively, after forming a plurality of second front side contact placeholder structures 52, wherein the plurality of second front side contact placeholder structures 52 are staggered relative to the plurality of first front side contact placeholder structures 32, and each first front side contact placeholder structure 32 is located beneath one of the second source/drain regions 46 and each second front side contact placeholder structure 52 is located above one of the first source/drain regions 28. Each second front side contact placeholder structure 52 includes a placeholder dielectric material as mentioned above (the dielectric material can be designed to introduce stress to adjacent structures. Each second front side contact placeholder structure 52 is formed by forming an opening through the second ILD material layer by lithography and etching. The opening is located between the second source/drain regions 46 as is shown in FIG. 7B. This etching stops on a topmost surface of the stacked FET device separating layer 34. One of the placeholder dielectric materials mentioned above for the first front side contact placeholder structures 32 is then deposited and thereafter a planarization process is used to remove any placeholder material that is formed outside the opening and on top of the second ILD material layer 48. The second front side contact placeholder structures have a topmost surface that is coplanar with a topmost surface of the second ILD material layer 48. The number of second front side contact placeholder structures 52 that is formed is not limited to three as is shown in FIG. 7B.

Referring now to FIGS. 8A-8B, there are illustrated the exemplary semiconductor structure shown in FIGS. 7A-7B, respectively, after forming a middle-of-the-line (MOL) dielectric material layer 54 having contact openings 58 that physically expose a first set of the second front side contact placeholder structures 52. The MOL dielectric material layer 54 can be composed of one of the dielectric materials mentioned above for the first ILD material layer 30. The MOL dielectric material layer 54 can be formed by a deposition process such as, for example, CVD, PECVD, or spin-on coating. The forming of the contact openings 58 includes depositing a masking material layer 56 such as am organic planarization layer (OPL) on the MOL dielectric material layer 54. The deposition of the masking material layer 56 includes, but is not limited to, CVD, PECVD, or spin-on coating. The as deposited masking material layer 56 is then patterned by lithography and etched to include a pre-contact opening. The pre-contact opening is then transferred into the MOL dielectric material layer 54 by utilizing a transfer etch. In some embodiments, the pre-contact opening and the contact openings 58 are formed utilizing a same etch.

Figure 9B:
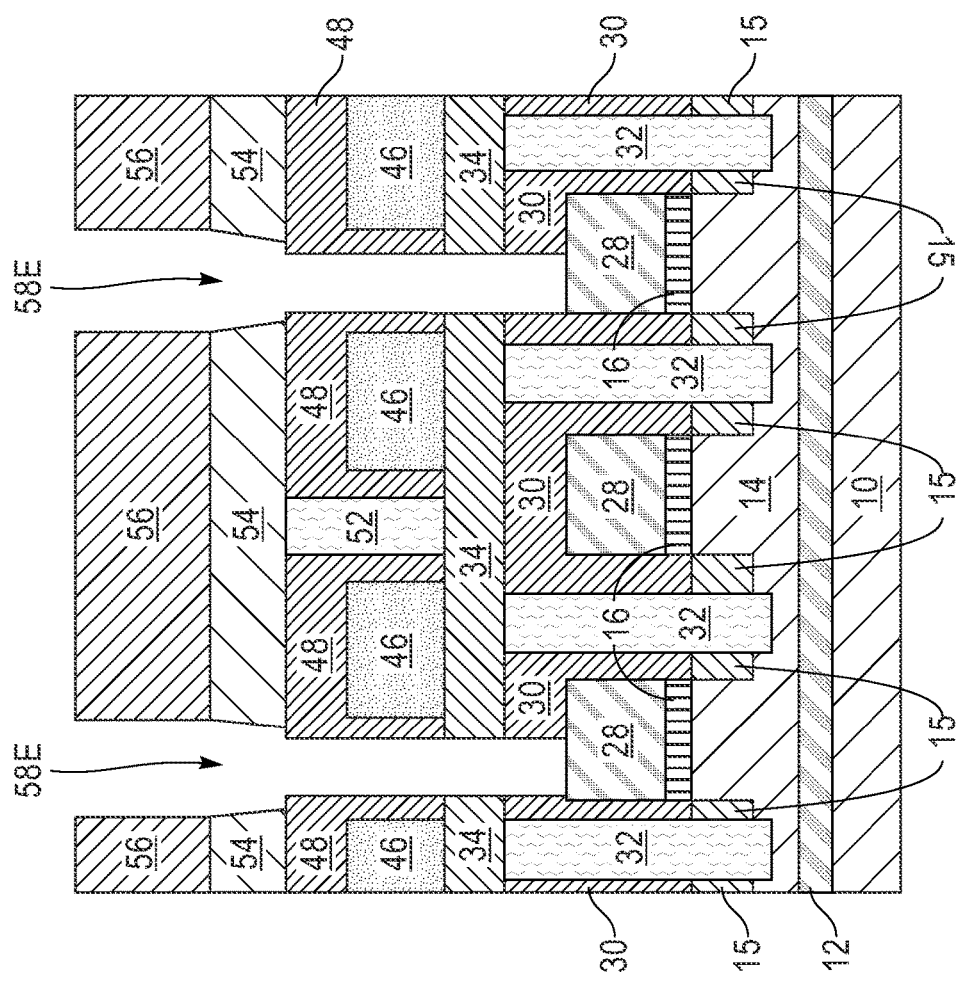
FIGS. 9A-9B are cross sectional views of the exemplary semiconductor structure shown in FIGS. 8A-8B, respectively, after removing via an etch, the physically exposed first set of the second front side contact placeholder structures, and continuing the etch to physically expose a first set of first source/drain regions that lay beneath the removed first set of the second front side contact placeholder structures.
Figure 9A:
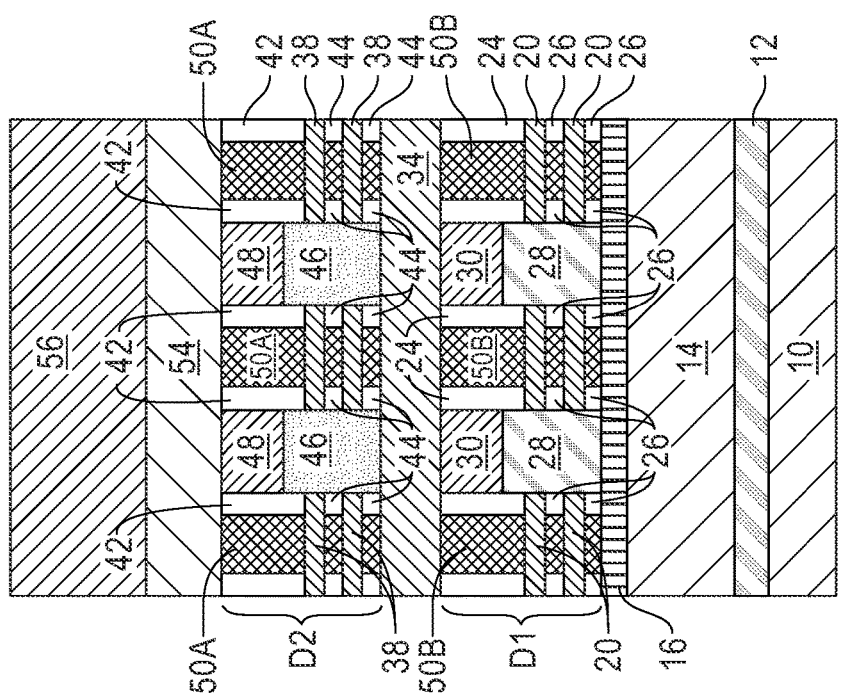

Referring now to FIGS. 9A-9B, there are illustrated the exemplary semiconductor structure shown in FIGS. 8A-8B, respectively, after removing via an etch, the physically exposed first set of the second front side contact placeholder structures 52, and continuing the etch to physically expose a first set of first source/drain regions 28 that lay beneath the removed first set of the second front side contact placeholder structures 52. This provides extended contact openings 58E as is shown in FIG. 9B. The etch used to remove the physically exposed first set of the second front side contact placeholder structures 52 is selective in removing the placeholder material that provides the second front side contact placeholder structures 52. The continued etching includes another etch that removes the second ILD material layer 48, the stacked FET device separating layer 34 and the first ILD material layer 30, while stopping on a surface of the underlying first source/drain region 28. This continued etch can be different from the etch used to remove the physically exposed first set of the second front side contact placeholder structures 52. After forming the structure shown in FIGS. 9A-9B, the masking material layer 56 can be removed utilizing from on top of the MOL dielectric material layer 54 utilizing a material removal process that is selective in removing the masking material that provides the masking material layer 56.

Referring now to FIGS. 10A-10B, there are illustrated the exemplary semiconductor structure shown in FIGS. 9A-9B, respectively, after forming source/drain contact openings 60 that physically expose a first set of the second source/drain regions 46. As is shown in FIG. 10B, at least one of the second source/drain contact openings 60 can merge with one of the extended contact openings 58E. The source/drain contact openings 60 can be formed by lithography and etching.

Referring now to FIGS. 11A-11B, there are illustrated the exemplary semiconductor structure shown in FIGS. 10A-10B, respectively, after forming front side source/drain contain structures 61, 62, 63 in the various contact openings 60 as well as the extending openings 58E provided by the etching in FIGS. 8A-8B. In the present application, the front side source/drain contact structure that contacts only one of the first source/drain regions 28 can be referred to as first source/drain region front side contact structure 61, the front side source/drain contact structure that contacts only one of the second source/drain regions 46 can be referred to as a second source/drain region front side contact structure 62, and the front side source/drain contact structure that contacts both a first source/drain region 28 and a second source/drain region 46 can be referred to as a shared source/drain contact structure 63.

The front side source/drain contain structures 61, 62, 63 can be formed utilizing any well-known metallization process. The front side source/drain contain structures 61, 62, 63 include at least a contact conductor material such as, for example, W, Cu, Al, Co, Ru, Mo, Os, Jr, Rh or an alloy thereof. In embodiments, each front side source/drain contain structures 61, 62, 63 can also include a silicide liner such as TiSi, NiSi, NiPtSi, etc., and an adhesion metal liner, such as TiN. The contact conductor material can be formed by any suitable deposition method such as, for example, ALD, CVD, PVD or plating. In some embodiments (not shown), a metal semiconductor alloy region can be formed in each of the contact openings 62 and the extending openings 58 prior to forming the contact conductor material. The metal semiconductor alloy region can be composed of a silicide or germicide. In one or more embodiments of the present application, the metal semiconductor alloy region can be formed by first depositing a metal layer (not shown) in the trenches. The metal layer can include a metal such as Ni, Co, Pt, W, Ti, Ta, a rare earth metal (e.g., Er, Yt, La), an alloy thereof, or any combination thereof. The metal layer can be deposited by ALD, CVD, PVD or ALD. The thickness of the metal layer can be from 2 nm to 10 nm, although lesser and greater thicknesses can also be employed. A diffusion barrier (not shown) such as, for example, TiN or TaN, can then be formed over the metal layer. An anneal process can be subsequently performed at an elevated temperature to induce reaction of the semiconductor material of the source/drain regions to provide the metal semiconductor alloy region. The unreacted portion of the metal layer, and, if present, the diffusion barrier, are then removed, for example, by an etch process (or a plurality of etching processes). In one embodiment, the etching process can be a wet etch that removes the metal in the metal layer selective to the metal semiconductor alloy in the metal semiconductor alloy regions.

Each front side source/drain contain structures 61, 62, 63 can include one or more source/drain contact liners (not shown). In one or more embodiments, the contact liner (not shown) can include a diffusion barrier material. Exemplary diffusion barrier materials include, but are not limited to, Ti, Ta, Ni, Co, Pt, W, Ru, TiN, TaN, WN, WC, an alloy thereof, or a stack thereof such as Ti/TiN and Ti/WC. The contact liner can be formed utilizing a conformal deposition process including CVD or ALD. The contact liner that is formed can have a thickness ranging from 1 nm to 5 nm, although lesser and greater thicknesses can also be employed.

In any of the embodiments mentioned above, block mask technology can be employed in order to vary the compositional make-up of the front side source/drain contain structures 61, 62, 63.

Referring now to FIGS. 12A-12B, there are shown the exemplary semiconductor structure shown in FIGS. 11A-11B, respectively, after forming a back-end-of-the-line (BEOL) dielectric material layer 64 and M1 signal lines 66L; some of the signal lines 66L include a metal via that connects the signal line to one of the front side source/drain contain structures 61, 62, 63. Notably, metal via 66B is used to connect one of the signal lines 66L to the first source/drain region front side contact structure 61, metal via 66C is used to connect one of the signal lines 66L to the second source/drain region front side contact structure 62, and metal via 66D connects one of the signal lines 66L to the shared source/drain contact structure. Also, a metal via 66A is used to connect one of the signal lines 66L to the second portion 50A of the functional gate structure as is shown in FIG. 12A.

The BEOL dielectric material layer 64 includes any interconnect dielectric material as well as the dielectric materials mentioned above in providing the first ILD material layer 30. The BEOL dielectric material layer 64 can be formed by a deposition process including, for example, CVD, PECVD, ALD or spin-on coating. The signal lines 66L including metal vias 66A, 66B, 66C and 66D can be formed utilizing any well-known metallization process. The signal lines 66L including metal vias 66A, 66B, 66C and 66D are composed of electrically conductive materials such as Cu, Co, W, or Ru, with a thin metal adhesion liner.

Referring now to FIGS. 13A-13B, there are illustrated the exemplary semiconductor structure shown in FIGS. 12A-12B, respectively, after forming an additional BEOL structure 68, and a carrier wafer 70. The additional BEOL structure 68 includes one or more interconnect dielectric material layers that contain one or more wiring/vias regions embedded thereon. The additional BEOL structure 68 can be formed utilizing BEOL processing techniques that are well known to those skilled in the art. The carrier wafer 70 can include one of the semiconductor materials mentioned above for the first semiconductor material layer 10. In the present application, the carrier wafer 70 is bonded to the additional BEOL structure 68. This includes the processing of the front side of the wafer; i.e., the part of the structure that is located above the semiconductor substrate.

Referring now to FIGS. 14A-14B, there are illustrated the exemplary semiconductor structure shown in FIGS. 13A-13B, respectively, after wafer flipping (180°) so as to allow backside processing of the structure. Flipping of the structure can be performed by hand or by utilizing a mechanical means such as, for example, a robot arm. After flipping the first semiconductor material layer 10 is now physically exposed.

Referring now to FIGS. 15A-15B, there are illustrated the exemplary semiconductor structure shown in FIGS. 14A-14B, respectively, after removing the first semiconductor material layer 10 of the semiconductor substrate to physically expose the etch stop layer 12 of the semiconductor substrate. The removal of the first semiconductor material layer 10 can be performed utilizing a material removal process that is selective in removing the semiconductor material that provides the first semiconductor material layer 10.

Referring now to FIGS. 16A-16B, there are illustrated the exemplary semiconductor structure shown in FIGS. 15A-15B, respectively, after removing the etch stop layer 12 and the second semiconductor material layer 14 of the semiconductor substrate. The bottom dielectric isolation layer 16 as well as the shallow trench isolation region 15 and the first front side contact placeholder structures 32 are physically exposed after these removal steps. The removal of the etch stop layer 12 includes a material removal process that is selective in removing the etch stop layer 12. The removal of the second semiconductor material layer 14 includes a material removal process that is selective in removing the second semiconductor material layer 14. In some embodiments, it is possible to remove the first semiconductor material layer 10, the etch stop layer 12 and the second semiconductor layer 14 utilizing a single material removal process.

Referring now to FIGS. 17A-17B, there are illustrated the exemplary semiconductor structure shown in FIGS. 16A-16B, respectively, after forming a backside ILD material layer 72. The backside ILD material layer 72 includes one of the dielectric materials mentioned above for the first ILD material layer 30. The backside ILD material layer 72 can be formed utilizing a deposition process such as, for example, CVD, PECVD, or ALD.

Referring now to FIGS. 18A-18B, there are illustrated the exemplary semiconductor structure shown in FIGS. 17A-17B, respectively, after forming a patterned mask 74 on the backside ILD material layer 72, wherein the patterned mask 74 has an opening 76 that physically exposes one of the first front side contact placeholder structures 32. The patterned mask 74 includes any masking material such as, for example, OPL. The patterned mask 74 can be formed by deposition of the masking material, followed by lithographic patterning.

Referring now to FIGS. 19A-19B, there are illustrated the exemplary semiconductor structure shown in FIGS. 18A-18B, respectively, after etching through the structure utilizing the pattern mask 74 as an etch mask to physically expose a surface of one of the second source/drain regions 46; the physically exposed second source/drain region 46 should not include any front side source/drain contain structures 61, 62, 63 contacting it. This etch includes one or more etching processes that is(are) capable of removing the physically exposed first front side contact placeholder structure 32, and the underlying stacked FET device separating layer 34. Backside contact opening 76E is formed by this step of the present application. After forming the backside contact opening 76E, the patterned mask 74 can be removed utilizing any material removal process that is selective in removing the masking material that provides the patterned mask 74.

Referring now to FIGS. 20A-20B are cross sectional views of the exemplary semiconductor structure shown in FIGS. 19A-19B, respectively, after forming a backside first source/drain contact opening 78 to physically expose one of the first source/drain regions 28; the backside first source/drain contacting opening 78 physically exposes on the first source/drain regions 28 that does not include any front side source/drain contain structures 61, 62, 63 contacting it. The backside first source/drain contact opening 78 can be formed by lithography and etching. This etch removes portions of the backside ILD material layer 72, and the bottom dielectric isolation layer 16.

Referring now to FIGS. 21A-21B, there are illustrated the exemplary semiconductor structure shown in FIGS. 20A-20B, respectively, after forming backside source/drain contact structures 80, 81 in the contact opening 78 as well as the opening (i.e., 76E) provided by the etch performed in FIGS. 19A-19B. The backside source/drain contact structure that contacts the first source/drain region 28 can be referred to as first backside source/drain contact structure 80, while the backside source/drain contact structure that contacts the second source/drain region 46 can be referred to as second backside source/drain contact structure 81. The backside source/drain contact structures 80, 81 can includes materials as mentioned above for the front side source/drain contain structures 61, 62, 63. The backside source/drain contact structures 80, 81 can be formed utilizing any well-known metallization process, Referring now to FIGS. 22A-22B, there are illustrated the exemplary semiconductor structure shown in FIGS. 21A-21B, respectively, after forming backside power rails 82, 83 and a backside power distribution network 84. Backside power rail 82 is a VDD power source, while backside power rail 83 is a VSS power source. This step of the present application begins by first forming additional backside ILD material on top the previously formed backside ILD material layer 72. Collectively, the backside ILD material layer 72 and the added backside ILD material are labeled as element 73 in the drawings. The backside power rails 82, 83 are then formed utilizing a metallization process. The backside power rails 82, 83 include an electrically conductive power rail material including, but not limited to, tungsten (W), cobalt (Co), ruthenium (Ru), aluminum (Al), copper (Cu), platinum (Pt), rhodium (Rh), or palladium (Pd) with a thin metal adhesion layer, such as TiN, TaN, etc.

As is shown, two of the backside power rail 83 that serve as a VSS source are connected to a first front side contact placeholder structure, while the other backside power rail 83 that serves as a VSS power source is connected to the second backside source/drain contact structure 81. As is also shown, two of the backside power rail 82 that serve as a VDD source is buried in the backside ILD material multilayered structure 73, while the other backside power rail 82 that serves as a VDD power source is connected to the backside source/drain contact structures 80.

After forming the backside electrically conductive structures 82, 83, the backside power distribution network 84 is formed. The backside power distribution network 84 includes elements/components that are configured to distribute power to the stacked FETs.

FIGS. 22A and 22B (flipped 180° from that which is shown) illustrate an exemplary semiconductor structure of the present application, which includes first FET device region, D1, including a plurality of first FETs, each first FET of the plurality of first FETs includes a first source/drain region 28 located on each side of a functional gate structure (i.e., first portion 50B of the functional gate structure defined above). A second FET device region, D2, is stacked above the first FET device region, D1, and includes a plurality of second FETs, each second FET of the plurality of second FETs includes a second source/drain region 46 located on each side of a functional gate structure (i.e., second portion 50B of the functional gate structure defined above). The structure further includes at least one first front side contact placeholder structure 32 located adjacent to one of the first source/drain regions 28 of at least one of the first FETs, and at least one second front side contact placeholder structure 52 located adjacent to at least one of the second source/drain regions 46 of at one of the second FETs. As mentioned previously, the first source/drain regions 28 are staggered relative to the second source/drain regions 46, and the at least one first front side contact placeholder structure 32 is staggered relative to the at least one first front side contact placeholder structure 32. In the present application, the at least one first front side contact placeholder structure 32 is located beneath one of the second source/drain regions 46, and the at least one second front side contact placeholder structure 52 is located on top of the one of first source/drain regions 28.

While the present application has been particularly shown and described with respect to preferred embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:
1. A semiconductor structure comprising:
a first field effect transistor (FET) device region comprising a plurality of first FETs, each first FET of the plurality of first FETs comprises a first source/drain region located on each side of a functional gate structure;
a second FET device region stacked above the first FET device region and comprising a plurality of second FETs, each second FET of the plurality of second FETs comprises a second source/drain region located on each side of a functional gate structure;
at least one first front side contact placeholder structure located adjacent to one of the first source/drain regions of at least one of the first FETs;

at least one second front side contact placeholder structure located adjacent to at least one of the second source/drain regions of at least one of the second FETs; and a Vss power source and a backside power distribution network located beneath the first FET device region, wherein the at least one first front side contact placeholder structure contacts the VSS power source and the VSS power source is connected to the backside power distribution network.

2. The semiconductor structure of claim 1, wherein a middle portion of each first source/drain region is staggered relative to a middle portion of each second source/drain region.

3. The semiconductor structure of claim 2, wherein an end portion of each first source/drain region overlaps an end portion of each second source/drain region.

4. The semiconductor structure of claim 2, wherein the at least one first front side contact placeholder structure is staggered relative to the second front side contact placeholder structure, and the at least one first front side contact placeholder structure is located beneath one of the second source/drain regions of one of the second FETs, and the at least one second front side contact placeholder structure is located above one of the first source/drain regions of one of the first FETs.

5. The semiconductor structure of claim 1, further comprising a stacked FET device separating layer separating the first FET device region from the second FET device region.

6. The semiconductor structure of claim 1, further comprising a bottom dielectric isolation layer located beneath each first source/drain region and present in the first FET device region.

7. The semiconductor structure of claim 1, further comprising signal lines located above the second FET device region, wherein the signal lines are in contact with an additional back-end-of-the-line (BEOL) structure.

8. The semiconductor structure of claim 7, wherein a carrier wafer is located on the additional BEOL structure.

9. The semiconductor structure of claim 1, wherein another of the second source/drain regions is wired to a VDD power source by a backside source/drain contact structure that extends from the second FET device region and entirely through the first FET device region.

10. The semiconductor structure of claim 1, wherein another of the first source/drain regions is wired to the VSS power source by a backside source/drain contact structure that extends into the first FET device region.

11. The semiconductor structure of claim 1, wherein another of the first source/drain regions and another of the second source/drain regions are electrically connected by a shared source/drain contact structure.

12. The semiconductor structure of claim 1, wherein the at least one first front side contact placeholder structure and the at least one second front side contact placeholder structure both comprise a placeholder dielectric material.

13. The semiconductor structure of claim 1, wherein at least one of the first source/drain regions is wired to a signal line located above the second FET device region by a first source/drain region front side contact structure and a metal via.

14. The semiconductor structure of claim 1, wherein at least one of the second source/drain regions is wired to a signal line located above the second FET device region by a second source/drain region front side contact structure and a metal via.

15. The semiconductor structure of claim 1, wherein each of the first source/drain regions is located on a surface of a bottom dielectric isolation layer, and each of the second source/drain regions is located on a surface of a stacked FET device separating layer that is positioned between the first FET device region and the second FET device region.

16. The semiconductor structure of claim 1, wherein the first FETs and the second FETs are nanosheet containing FETs and wherein the functional gate structure wraps around a semiconductor channel material nanosheet that is present in each of the first FET device region and the second FET device region.

17. The semiconductor structure of claim 1, wherein the first FETs are of a first conductivity type and the second FETs are of a second conductivity type, and wherein the second conductivity type is a same conductivity type or a different conductivity type than the first conductivity type.

18. A semiconductor structure comprising:
a first field effect transistor (FET) device region comprising a plurality of first FETs, each first FET of the plurality of first FETs comprises a first source/drain region located on each side of a functional gate structure;
a second FET device region stacked above the first FET device region and comprising a plurality of second FETs, each second FET of the plurality of second FETs comprises a second source/drain region located on each side of a functional gate structure;
at least one first front side contact placeholder structure located adjacent to one of the first source/drain regions of at least one of the first FETs; and
at least one second front side contact placeholder structure located adjacent to at least one of the second source/drain regions of at least one of the second FETs, wherein the at least one first contact placeholder structure extends through a shallow trench isolation region and a first interlayer dielectric material layer, the first interlayer dielectric material layer is located laterally adjacent to, and above, each first source/drain region, and the at least one second front side contact placeholder structure extends through a second interlayer dielectric material layer, the second interlayer dielectric material layer is located laterally adjacent to, and above, each second source/drain region.

19. A semiconductor structure comprising:
a first field effect transistor (FET) device region comprising a plurality of first FETs, each first FET of the plurality of first FETs comprises a first source/drain region located on each side of a functional gate structure;
a second FET device region stacked above the first FET device region and comprising a plurality of second FETs, each second FET of the plurality of second FETs comprises a second source/drain region located on each side of a functional gate structure;

at least one first front side contact placeholder structure located adjacent to one of the first source/drain regions of at least one of the first FETs; and at least one second front side contact placeholder structure located adjacent to at least one of the second source/drain regions of at least one of the second FETs, wherein the at least one first front side contact placeholder structure is staggered relative to the second front side contact placeholder structure, and the at least one first front side contact placeholder structure is located beneath one of the second source/drain regions of one of the second FETs, and the at least one second front side contact placeholder structure is located above one of the first source/drain regions of one of the first FETs.

\* \* \* \* \*